(12) United States Patent
Peng et al.

(10) Patent No.: US 11,935,752 B2
(45) Date of Patent: Mar. 19, 2024

(54) DEVICE OF DIELECTRIC LAYER

(71) Applicant: TAIWAN SEMICONDUCTOR MANUFACTURING CO., LTD., Hsinchu (TW)

(72) Inventors: Yu-Yun Peng, Hsinchu (TW); Chung-Chi Ko, Nantou County (TW); Keng-Chu Lin, Pingtung County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 258 days.

(21) Appl. No.: 17/200,133

(22) Filed: Mar. 12, 2021

(65) Prior Publication Data
US 2021/0202254 A1 Jul. 1, 2021

Related U.S. Application Data

(62) Division of application No. 16/015,743, filed on Jun. 22, 2018, now Pat. No. 10,957,543.

(60) Provisional application No. 62/565,696, filed on Sep. 29, 2017.

(51) Int. Cl.
*H01L 21/28* (2006.01)
*H01L 21/02* (2006.01)
*H01L 21/762* (2006.01)

(52) U.S. Cl.
CPC .. *H01L 21/28158* (2013.01); *H01L 21/02126* (2013.01); *H01L 21/02164* (2013.01); *H01L 21/02167* (2013.01); *H01L 21/0217* (2013.01); *H01L 21/022* (2013.01);
(Continued)

(58) Field of Classification Search
CPC ......... H01L 21/76832; H01L 21/76834; H01L 29/66545; H01L 29/66628; H01L 21/28158; H01L 21/02126; H01L 21/02164; H01L 21/02167; H01L 21/0217; H01L 21/022; H01L 21/02208; H01L 21/02211; H01L 21/02274; H01L 21/76224
See application file for complete search history.

(56) References Cited

U.S. PATENT DOCUMENTS

2002/0070430 A1 6/2002 Oh et al.
2002/0127818 A1 9/2002 Lee et al.
(Continued)

OTHER PUBLICATIONS

Fainer et al., "PECVD Synthesis of Silicon Carbonitride Layers Using Methyltris(diethylamino) silane as the New Single-Source Precursor", ECS Journal of Solid State Science and Technology, 4 (1) N3153-N3163, Nov. 7, 2014.

*Primary Examiner* — Bitew A Dinke
(74) *Attorney, Agent, or Firm* — Maschoff Brennan

(57) ABSTRACT

A device includes a first dielectric layer, a first conductor, an etch stop layer, a second dielectric layer, and a second conductor. The first conductor is in the first dielectric layer. The etch stop layer is over the first dielectric layer. The etch stop layer has a first surface facing the first dielectric layer and a second surface facing away from the first dielectric layer, and a concentration of carbon in the etch stop layer periodically varies from the first surface to the second surface. The second dielectric layer is over the etch stop layer. The second conductor is in the second dielectric layer and the etch stop layer and electrically connected to the first conductor.

20 Claims, 20 Drawing Sheets

(52) U.S. Cl.
CPC .. *H01L 21/02208* (2013.01); *H01L 21/02211* (2013.01); *H01L 21/02274* (2013.01); *H01L 21/76224* (2013.01)

(56) References Cited

U.S. PATENT DOCUMENTS

| | | | |
|---|---|---|---|
| 2003/0038334 A1* | 2/2003 | Kim | H01L 21/76224 257/E21.546 |
| 2004/0029353 A1* | 2/2004 | Zheng | H01L 21/76232 257/E21.549 |
| 2005/0118784 A1 | 6/2005 | Kim | |
| 2008/0166854 A1 | 7/2008 | Shin et al. | |
| 2010/0123211 A1* | 5/2010 | Kim | H01L 29/66621 257/E29.007 |
| 2010/0240194 A1 | 9/2010 | Jung et al. | |
| 2010/0248465 A1 | 9/2010 | Yi et al. | |
| 2011/0127634 A1 | 6/2011 | Eun | |
| 2013/0052795 A1* | 2/2013 | Watanabe | H01L 21/76229 257/E21.546 |
| 2013/0071580 A1* | 3/2013 | Weidman | C23C 16/36 427/535 |
| 2013/0210199 A1 | 8/2013 | Chen et al. | |
| 2013/0260576 A1* | 10/2013 | Kadonaga | C23C 16/308 438/791 |
| 2014/0256153 A1* | 9/2014 | Grill | H01L 21/02126 438/762 |
| 2015/0041868 A1* | 2/2015 | Cheng | H01L 21/28079 257/288 |
| 2015/0041869 A1* | 2/2015 | Pham | H01L 29/66545 257/288 |
| 2015/0044881 A1 | 2/2015 | Shimamoto et al. | |
| 2015/0108561 A1 | 4/2015 | Kim et al. | |
| 2015/0162185 A1 | 6/2015 | Pore | |
| 2015/0194343 A1 | 7/2015 | Chi et al. | |
| 2015/0235844 A1 | 8/2015 | Wang et al. | |
| 2015/0364378 A1* | 12/2015 | Xie | H01L 29/41783 438/587 |
| 2016/0020294 A1* | 1/2016 | Koo | H01L 29/66636 257/288 |
| 2016/0024647 A1 | 1/2016 | Saly et al. | |
| 2016/0079288 A1* | 3/2016 | Choi | H01L 27/14698 438/57 |
| 2016/0111425 A1* | 4/2016 | Chen | H01L 21/823814 257/369 |
| 2016/0133623 A1* | 5/2016 | Xie | H01L 23/528 438/586 |
| 2016/0314965 A1 | 10/2016 | Nguyen et al. | |
| 2017/0133216 A1 | 5/2017 | Niskanen et al. | |
| 2017/0179246 A1* | 6/2017 | Xie | H01L 29/4232 |
| 2017/0103885 A1 | 9/2017 | Nakamura et al. | |
| 2018/0096842 A1 | 4/2018 | Varadarajan et al. | |
| 2019/0088487 A1* | 3/2019 | Ramkumar | H01L 21/02238 |
| 2019/0103276 A1* | 4/2019 | Peng | H01L 21/28158 |
| 2019/0103312 A1* | 4/2019 | Suen | H01L 21/76829 |
| 2019/0103414 A1* | 4/2019 | Ramkumar | H10B 43/30 |
| 2019/0157075 A1 | 5/2019 | Tu et al. | |

\* cited by examiner

DEVICE OF DIELECTRIC LAYER

PRIORITY CLAIM AND CROSS-REFERENCE

This application is a divisional of U.S. patent application Ser. No. 16/015,743, filed Jun. 22, 2018, now U.S. Pat. No. 10,957,543, issued Mar. 23, 2021, which claims priority to U.S. Provisional Application Ser. No. 62/565,696, filed Sep. 29, 2017, which is herein incorporated by reference.

BACKGROUND

With advances in semiconductor technology, there has been increasing demand for high storage capacity, fast processing systems, high performance, and low costs. To meet these demands, the semiconductor industry continues to scale down dimension of semiconductor devices, such as metal oxide semiconductor field effect transistors (MOSFETs), and finFETs, and also increase packing density of these semiconductor devices on an integrated circuit (IC) to accommodate a larger number of the semiconductor devices on an IC. Such scaling down has increased the complexity of processing and manufacturing of the semiconductor devices in ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
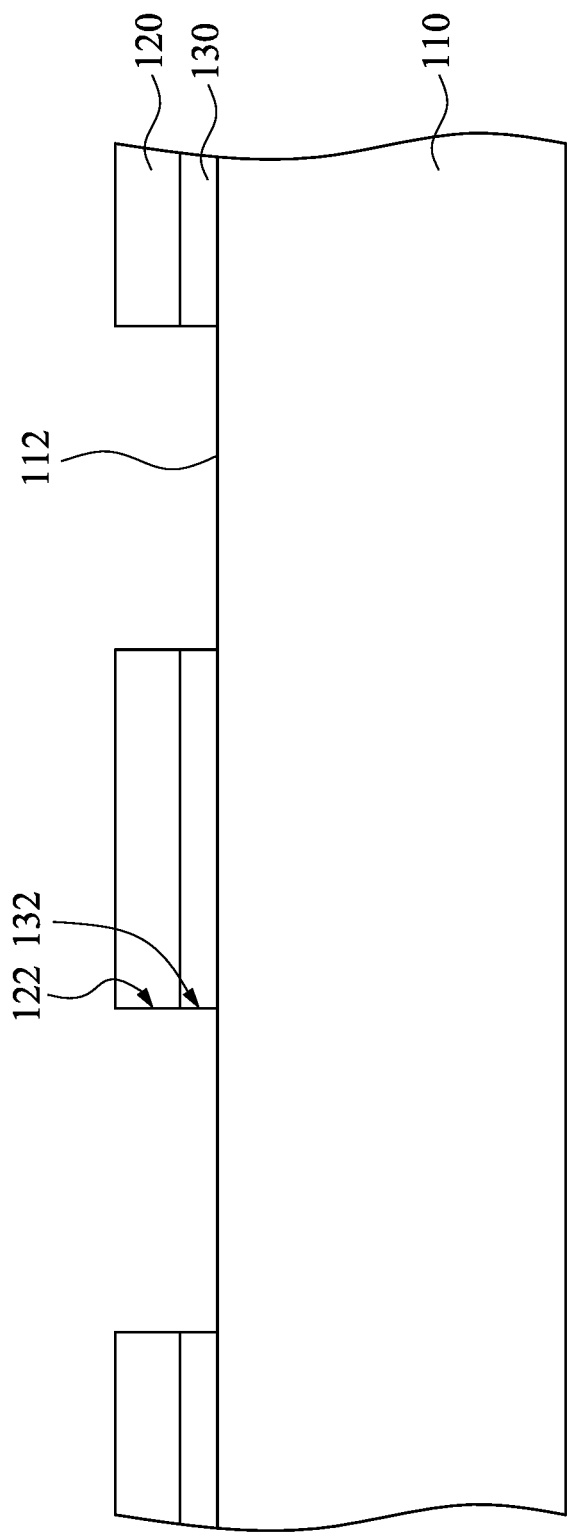
FIGS. 1A-1G are cross-sectional views of a method for manufacturing a semiconductor structure at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure relate to semiconductor structures and methods for forming the semiconductor structures including a composite dielectric layer. The properties of the composite dielectric layer can be modulated by tuning materials of precursors, materials of process gases, deposition cycles of dielectric layers, layers of the dielectric layers, deposition temperatures, carbon additions, plasma treatments, and/or other suitable parameters.

FIGS. 1A-1G are cross-sectional views of a method for manufacturing a semiconductor structure at various stages in accordance with some embodiments of the present disclosure. In some embodiments, the semiconductor structure shown in FIGS. 1A-1G may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Reference is made to FIG. 1A. A substrate 110 is provided. In some embodiments, the substrate 110 may include silicon (Si). Alternatively, the substrate 110 may include germanium (Ge), silicon germanium, gallium arsenide (GaAs), or other appropriate semiconductor materials. In some alternative embodiments, the substrate 110 may include an epitaxial layer. Furthermore, the substrate 110 may include a semiconductor-on-insulator (SOI) structure having a buried dielectric layer therein. The buried dielectric layer may be, for example, a buried oxide (BOX) layer. The SOI structure may be formed by a method referred to as separation by implantation of oxygen (SIMOX) technology, wafer bonding, selective epitaxial growth (SEG), or other appropriate method.

A patterned mask layer 120 (may be a hard mask layer) is formed over the top surface 112 of the substrate 110. In some embodiments, the patterned mask layer 210 includes nitride. For example, the mask layer 120 is made of silicon nitride (SiN). However, other materials, such as SiON, silicon carbide, or combinations thereof, may also be used. The mask layer 120 may be formed by a process such as chemical vapor deposition (CVD), plasma enhanced chemical vapor deposition (PECVD), or low pressure chemical vapor deposition (LPCVD). Alternatively, the mask layer 120 may be made of a silicon oxide and then converted to SiN by nitridation.

In some embodiments, a protective layer 130 is formed over the top surface 112 of the substrate 110 and between the mask layer 120 and the substrate 110. The protective layer 130 protects the top surface 112 from direct contact with the mask layer 120. For example, the protective layer 130 can protect active regions formed in the substrate 110. The active regions are used for forming devices (such as transistors, resistors, etc.). Depending upon the devices to be formed, the active regions may include either an n-well or a p-well as determined by the design conditions. In some embodiments, the protective layer 130 is made of a thermal oxide. Once formed, the mask layer 120 and the protective layer 130 are patterned through suitable photolithographic and etching processes to form openings 122 and 132 over the top surface 112.

Figure 1B:
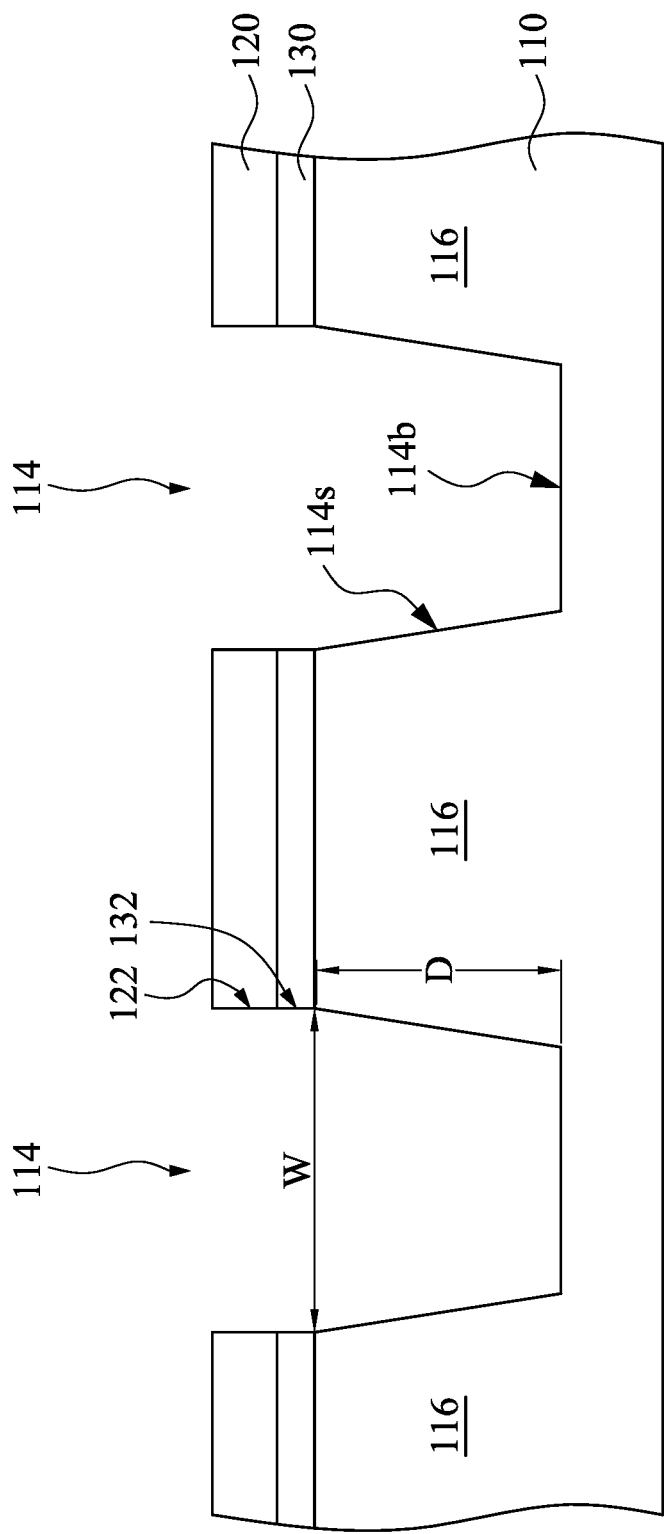

Reference is made to FIG. 1B. The exposed portions of the substrate 110 through the openings 122 and 132 are removed by an etching process, such as reactive ion etching (RIE), in order to form the trenches 114 in the substrate 110. The trench 114 has a bottom 114b and sidewalls 114s. In some embodiments, at least one of the trenches 114 has a width W and a depth D. An aspect ratio, the depth D (sometimes referred to herein as trench height) divided by the width W, of the trench 114 can be in a range from about 6 to about 12. One skilled in the art will realize, however, that the dimensions and values recited throughout the descriptions are examples, and may be changed to suit different scales of semiconductor devices.

In some embodiments, the semiconductor device can be a fin field effect transistor (FinFET), and the trenches 114 are configured to separate adjacent two semiconductor fins 116 formed in the substrate 110. In other words, one of the semiconductor fins 116 is between adjacent two of the trenches 114.

Figure 1C:
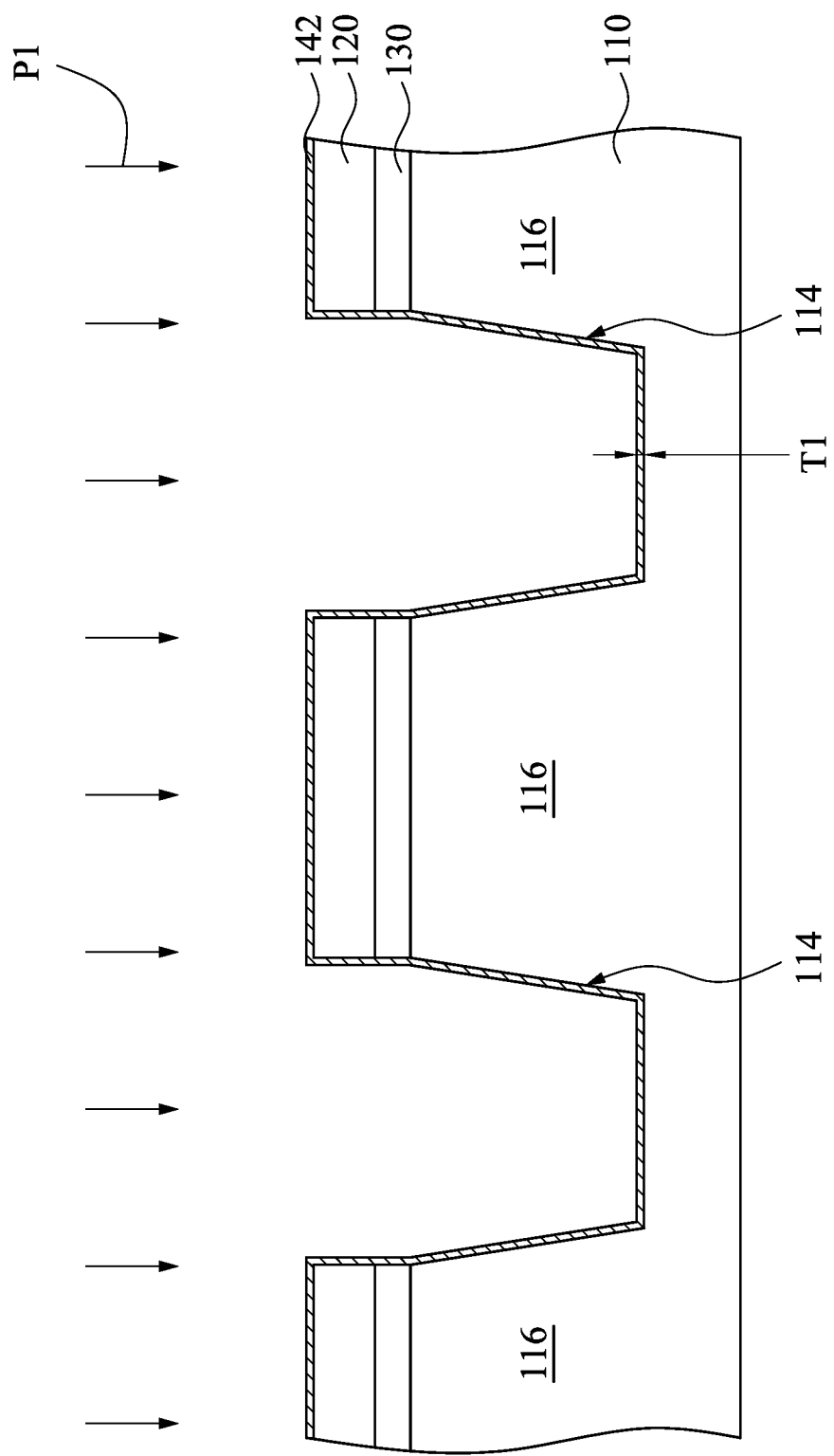

Reference is made to FIG. 1C. A first dielectric layer 142 is conformally formed over the structure of FIG. 1B. The first dielectric layer 142 is formed using a deposition technique that can form conformal dielectric layers, such as atomic layer deposition (ALD). Atomic layer deposition (ALD) is an approach to filling dielectrics that involves depositing a monolayer of precursor over the substrate 110, purging the chamber, and introducing a reactant that reacts with the precursor to leave a monolayer of product. The cycle can be repeated many times to build a layer with a sufficient thickness to be functional. In FIG. 1C, the first dielectric layer 142 has a thickness T1, which is determined by the deposition cycles of first ALD processes. In some embodiments, the first dielectric layer 142 is formed by performing m cycles of the first ALD process to achieve the thickness T1.

During the first ALD processes, the structure of FIG. 1B is positioned on a chuck in an ALD process chamber. A vacuum is then applied to the ALD process chamber to remove oxygen and moisture and the temperature is raised to an acceptable level that is suitable for the ALD deposition. A first precursor P1 is then fed into the ALD process chamber. The first precursor P1 forms a conformal monolayer over the structure of FIG. 1B, i.e., over the substrate 110 and the patterned mask layer 120 and in the trenches 114. The first precursor P1 is a silicon-containing precursor and has a backbone formula written as $Si_wR_xH_yCl_z$, where R can be $CH_3$, $C_2H_5$, or other suitable amines, w=1 or 2, (x+y+z)=2w+2, and (x+y+z)≥0. For example, the first precursor P1 has a Si—Si backbone, and the present disclosure is not limited in this respect. In some embodiments, the first precursor P1 can be $Si(CH_3)HCl_2$, $Si_2Cl_6$, or $Si_2(CH_3)_2Cl_4$.

In some embodiments, process gases are fed into the ALD process chamber. The process gas can be a nitride-containing gas, such as $NH_3$, $N_2/H_2$, or other suitable gases. Hence, the first dielectric layer 142 further includes nitride, and is a nitride-containing dielectric layer. In some other embodiments, the process gas is an oxygen-containing gas, such as $O_2$, $H_2O$, and/or other suitable gases. Hence, the first dielectric layer 142 further includes oxygen, and is an oxygen-containing dielectric layer. In yet some other embodiments, the nitride-containing gas and the oxygen-containing gas are sequentially fed into the ALD process chamber to modulate the N/O ratio of the first dielectric layer 142. In some embodiments, the first ALD processes can be plasma-enhanced ALD processes. That is, the first ALD processes include plasma treatments, for example at a power in a range from about 25 watts to about 800 watts and at a frequency in a range from about 1M Hz to about 100M Hz.

In some embodiments, the first precursor P1 does not contain carbon. In embodiments where the first precursor P1 does not contain carbon, some other carbon-containing materials (such as carbon sources or organic hydrocarbons) may be provided. Carbon addition results in a layer with more resistance to wet etching process, such that increases the wet etch selectivity. In some embodiments, the carbon-containing materials may be chain-type hydrocarbon, written as $C_xH_y$, 2≤x≤4 and including at least one C=C bond. The carbons of C=C bond can be bond to Si or other elements of the first dielectric layer 142. Where the first precursor P1 is used that does contain carbon, the carbon-containing materials may be not added, although the carbon-containing materials may be also added to increase the carbon content of the first dielectric layer 142. The above mentioned processes (the first precursor P1 feeding process, the process gas feeding process, the plasma treatments, and/or the carbon addition process) are separated by individual purge periods.

Figure 1D:
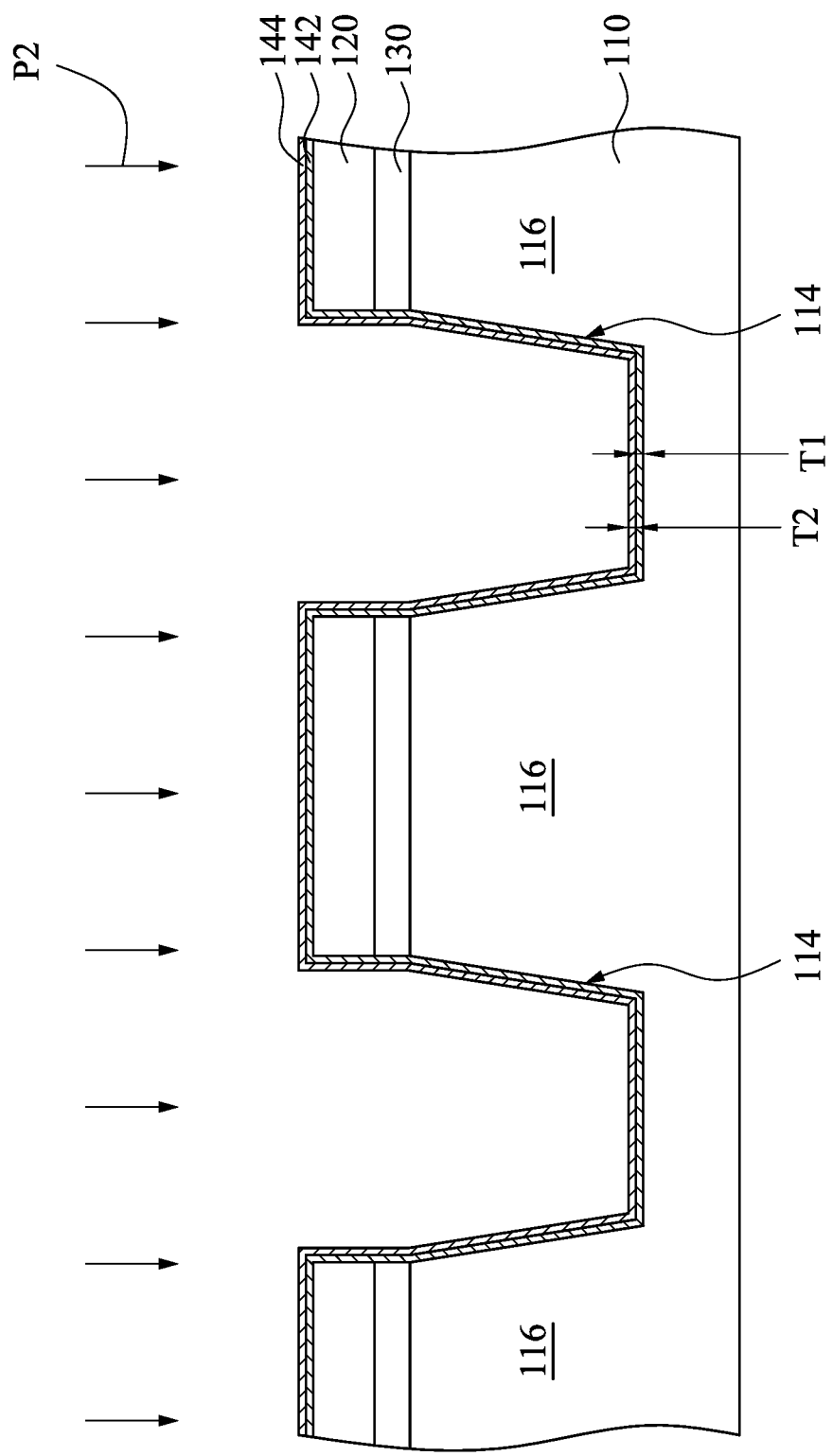

Reference is made to FIG. 1D. A second dielectric layer 144 is conformally formed over the first dielectric layer 142. The second dielectric layer 144 is formed using a deposition technique that can form conformal dielectric layers, such as atomic layer deposition (ALD). In FIG. 1D, the second dielectric layer 144 has a thickness T2, which is determined by the deposition cycles of second ALD processes. In some embodiments, the second dielectric layer 144 is formed by performing n cycles of the second ALD process to achieve the thickness T2. In some embodiments, n is greater than m, such that the thickness T2 is greater than the thickness T1. In some other embodiments, n is less than m, such that the thickness T2 is less than the thickness T1. In yet some other embodiments, n is equal to m, such that the thickness T2 is substantially the same as the thickness T1. In some embodiments, m/n is in a range from about 0.25 to about 4. The term "substantially" as used herein may be applied to modify any quantitative representation which could permissibly vary without resulting in a change in the basic function to which it is related.

During the second ALD processes, a second precursor P2 is fed into the ALD process chamber. The second precursor P2 forms a conformal monolayer over the first dielectric layer 142. The second precursor P2 is a silicon-containing precursor different from the first precursor P1 (see FIG. 1C) and have a backbone formula written as $Si(CH_2)SiR_xR_yCl_z$ in some embodiments, where R can be $CH_3$, $C_2H_5$, or other suitable amines, (x+y+z)=6, and (x+y+z)≥0. Alternatively, the second precursor P2 has a backbone formula written as $Si_wR_xH_yCl_z$, where R can be $CH_3$, $C_2H_5$, or other suitable amines, w=1 or 2, (x+y+z)=2w+2, and (x+y+z)≥0. For example, the second precursor P2 has a Si—C—Si backbone or a Si—Si backbone, and the present disclosure is not limited in this respect. In some embodiments, the second precursor P2 can be $Si(CH_2)Si(CH_3)Cl_5$, $(CH_2)Si_2Cl_6$, or $Si_2(CH_3)_2Cl_4$.

In some embodiments, a process gas is fed into the ALD process chamber. The process gas can be an oxygen-containing gas, such as $O_2$, $H_2O$, and/or other suitable gases. Hence, the second dielectric layer 144 further includes oxygen, and is an oxygen-containing dielectric layer. In some embodiments, the second ALD processes can be plasma-enhanced ALD processes. That is, the second ALD processes include plasma treatments, for example at a power in a range from about 25 watts to about 800 watts and at a frequency in a range from about 1M Hz to about 100M Hz. The above mentioned processes (the second precursor P2 feeding process, the process gas feeding process, and/or the plasma treatments) are separated by individual purge periods.

Reference is made to FIGS. 1C and 1D. In some embodiments, the first and/or second precursors P1 and/or P2 include chlorosilane. That is, the first and/or second precursors P1 and/or P2 are chlorosilane-based precursors. For example, the chlorosilane-based precursor includes at least one Si—Cl bond. The number of silicon in the chlorosilane-based precursor may be 1 or 2. The chlorine contents in the chlorosilane-based precursors associated with the operation temperatures of the first and second ALD processes. By tuning the chlorine contents in the first and second precursors P1 and P2, the first and second ALD processes can be performed in a similar temperature range or the same temperature and thus in the same ALD chamber. Therefore, the first and second ALD processes are in-situ deposition processes.

Figure 1E:
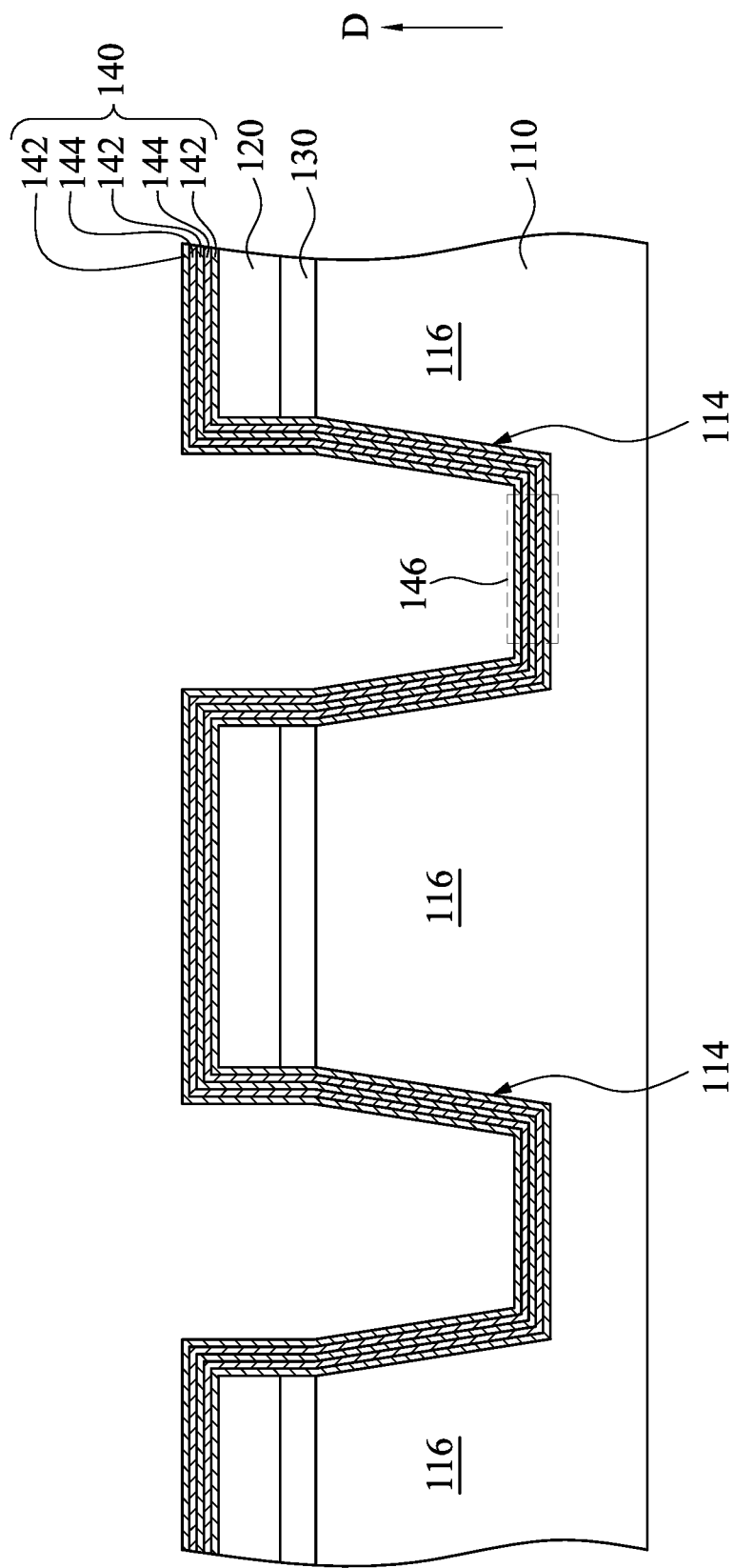

Reference is made to FIG. 1E. A plurality of first dielectric layers 142 and a plurality of second dielectric layers 144 are alternately formed over the substrate 110, such that a composite dielectric layer 140 is conformally formed. That is, the composite dielectric layer 140 includes alternately stacked first dielectric layers 142 and second dielectric layers 144. In FIG. 1E, the composite dielectric layer 140 includes three layers of the first dielectric layers 142 and two layers of the second dielectric layers 144. That is, the topmost layer and the bottommost layer are both first dielectric layers 142. It is note that the layers of the first dielectric layers 142 and the second dielectric layers 144 in FIG. 1E are illustrative, and should not limit the claimed scope of the present disclosure. A person having ordinary skill in the art may select suitable layers for the first dielectric layers 142 and the second dielectric layers 144 according to actual situations.

In some embodiments, the first precursor P1 (see FIG. 1C) is $Si_2Cl_6$, and the first dielectric layers 142 are formed by performing ALD processes such as thermal-ALD, PEALD, pulsed-PEALD, or other suitable depositing processes, such that the first dielectric layers 142 includes at least one Si—Si backbone. The process gases for forming the first dielectric layers 142 are $NH_3$ and $O_2$, $NH_3$ and $H_2O$, or other suitable gases. That is, the first dielectric layers 142 are nitride-rich and oxygen-rich layers, and the first dielectric layers 142 include at least one Si—N bond and/or at least one Si—O bond. In some embodiments, a carbon-containing material, such as $C_3H_6$ or other suitable materials, is added into the ALD chamber, such that the first dielectric layers 142 further include carbon, and includes at least one Si—C—N backbone and/or at least one Si—C—O backbone. The depositing temperature performed at a temperature in a range from about 300° C. to about 600° C. In some embodiments, at least one of the first dielectric layers 142 is formed by performing m cycles of the ALD processes, where m≥1.

Moreover, the second precursor P2 (see FIG. 1D) is $(CH_2)Si_2Cl_6$, and the second dielectric layers 144 are formed by performing ALD processes such as thermal-ALD, PEALD, pulsed-PEALD, or other suitable depositing processes, such that the second dielectric layers 144 include at least one Si—C—Si backbone. The process gases for forming the second dielectric layers 144 are $O_2$, $H_2O$, and/or other suitable gases. That is, the second dielectric layers 144 are oxygen-rich layers, and the second dielectric layers 144 include at least one Si—O bond. The depositing temperature performed at a temperature in a range from about 300° C. to about 600° C. Hence, the first dielectric layers 142 and the second dielectric layers 144 can be formed in the same chamber. In some embodiments, at least one of the second dielectric layers 144 is formed by performing n cycles of the ALD processes, where n≥1.

Hence, the composite dielectric layer 140 is made of $SiC_xO_yN_z$. Since the first dielectric layers 142 and the second dielectric layers 144 include different compositions of Si, C, O, and N, the concentrations of the Si, C, O, and N in the composite dielectric layer 140 are not uniform and vary periodically in a stacking direction D, in which the stacking direction D is a direction that the first and second dielectric layers 142 and 144 alternately stacked. Specifically, the concentration of Si in the first dielectric layer 142 is different from the concentration of Si in the second dielectric layer 144, the concentration of C in the first dielectric layer 142 (which may be zero if the carbon-containing material is not added during the formation of the first dielectric layer 142) is different from the concentration of C in the second dielectric layer 144, the concentration of N in the first dielectric layer 142 is different from the concentration of N in the second dielectric layer 144 (which is substantially zero), and the concentration of O in the first dielectric layer 142 is different from the concentration of O in the second dielectric layer 144. Taking a portion 146 of the composite dielectric layer 140 in contact with a bottom of the trench 114 as an example, the concentrations of Si, C, and O vary as the depth of the composite dielectric layer 140 increases, and the concentration of N in the first dielectric layer 142 is greater than the concentration of N in the second dielectric layer 144. Furthermore, if the first dielectric layers 142 are lack of carbon, the concentration of C in the first dielectric layer 142 is less than the concentration of C in the second dielectric layer 144. That is, the concentration of C is increased while the concentration of N is decreased, and the concentration of C is decreased while the concentration of N is increased.

The resulting composite dielectric layer 140 has a carbon concentration in a range from about 3% to about 15% and a nitrogen concentration in a range from about 15% to about 28%. The composite dielectric layer 140 has a Young's modulus in a range from about 120 GPa to about 190 GPa. The composite dielectric layer 140 has an ($NF_3$+$NH_3$) etching selectivity to oxide in a range of about 6.67 to about 10. In the present disclosure, the etching selectivity to oxide is defined by the rate of a chosen etchant (i.e., ($NF_3$+$NH_3$) in this case) etching oxide dividing the rate of the chosen etchant etching the composite dielectric layer 140.

In some other embodiments, the first precursor P1 (see FIG. 1C) is $Si_2Cl_6$, and the first dielectric layers 142 are formed by performing ALD processes such as thermal-ALD, PEALD, pulsed-PEALD, or other suitable depositing processes, such that the first dielectric layers 142 includes at least one Si—Si backbone. The process gases for forming the first dielectric layers 142 are $NH_3$ and $O_2$, $NH_3$ and $H_2O$, or other suitable gases. That is, the first dielectric layers 142 are nitride-rich and oxygen-rich layers, and the first dielectric layers 142 include at least one Si—N bond and/or at least one Si—O bond. In some embodiments, a carbon-containing material, such as $C_3H_6$ or other suitable materials, is added into the ALD chamber, such that the first dielectric layers 142 further include carbon, and includes at least one Si—C—N backbone and/or at least one Si—C—O backbone. The depositing temperature performed at a temperature in a range from about 350° C. to about 550° C. In some embodiments, at least one of the first dielectric layers 142 is formed by performing m cycles of the ALD processes, where m≥1.

Moreover, the second precursor P2 (see FIG. 1D) is $Si_2(CH_3)_2Cl_4$, and the second dielectric layers 144 are formed by performing ALD processes such as thermal-ALD, PEALD, pulsed-PEALD, or other suitable depositing processes, such that the second dielectric layers 144 include at least one Si—Si backbone. The process gases for forming the second dielectric layers 144 are $O_2$, $H_2O$, or other suitable gases. That is, the second dielectric layers 144 are oxygen-rich layers, and the second dielectric layers 144 include at least one Si—O bond. The depositing temperature performed at a temperature in a range from about 350° C. to about 550° C. Hence, the first dielectric layers 142 and the second dielectric layers 144 can be formed in the same chamber. In some embodiments, at least one of the second dielectric layers 144 is formed by performing n cycles of the ALD processes, where n≥1.

Hence, the composite dielectric layer 140 is made of $SiC_xO_yN_z$. Since the first dielectric layers 142 and the second dielectric layers 144 include different composition of Si, C, O, and N, the concentrations of the Si, C, O, and N in the composite dielectric layer 140 are not uniform and vary periodically in the stacking direction D. Specifically, the concentration of Si in the first dielectric layer 142 is different from the concentration of Si in the second dielectric layer 144, the concentration of C in the first dielectric layer 142 (which may be zero if the carbon-containing material is not added during the formation of the first dielectric layer 142) is different from the concentration of C in the second dielectric layer 144, the concentration of N in the first dielectric layer 142 is different from the concentration of N in the second dielectric layer 144 (which is substantially zero), and the concentration of O in the first dielectric layer 142 is different from the concentration of O in the second dielectric layer 144. Taking a portion 146 of the composite dielectric layer 140 in contact with a bottom of the trench 114 as an example, the concentrations of Si, C, and O vary as the depth of the composite dielectric layer 140 increases, and the concentration of N in the first dielectric layer 142 is greater than the concentration of N in the second dielectric layer 144. Furthermore, if the first dielectric layers 142 are lack of carbon, the concentration of C in the first dielectric layer 142 is less than the concentration of C in the second dielectric layer 144. That is, the concentration of C is increased while the concentration of N is decreased, and the concentration of C is decreased while the concentration of N is increased.

The resulting composite dielectric layer 140 has a carbon concentration in a range from about 5% to about 20% and a nitrogen concentration in a range from about 10% to about 20%. The composite dielectric layer 140 has a Young's modulus in a range from about 60 GPa to about 120 GPa. The composite dielectric layer 140 has a dielectric constant in a range from about 3.4 to about 5. The composite dielectric layer 140 has a $(CH_xF_y+O_2)$ plasma dry etching selectivity to nitride in a range of about 5 to about 8. In the present disclosure, the etching selectivity to nitride is defined by the rate of a chosen etchant (i.e., $(CH_xF_y+O_2)$) in this case) etching nitride dividing the rate of the chosen etchant etching the composite dielectric layer 140.

In still some other embodiments, the first precursor P1 (see FIG. 1C) is $Si_2(CH_3)_2Cl_4$, and the first dielectric layers 142 are formed by performing ALD processes such as thermal-ALD, PEALD, pulsed-PEALD, or other suitable depositing processes, such that the first dielectric layers 142 includes at least one Si—Si backbone. The process gases for forming the first dielectric layers 142 are $O_2$, $H_2O$, and/or other suitable gases. That is, the first dielectric layers 142 are oxygen-rich layers, and the first dielectric layers 142 include at least one Si—O bond and/or Si—C—O bond. The depositing temperature performed at a temperature in a range from about 300° C. to about 500° C. In some embodiments, at least one of the first dielectric layers 142 is formed by performing m cycles of the ALD processes, where m≥1.

Moreover, the second precursor P2 (see FIG. 1D) is $(CH_2)Si_2Cl_6$, and the second dielectric layers 144 are formed by performing ALD processes such as thermal-ALD, PEALD, pulsed-PEALD, or other suitable depositing processes, such that the second dielectric layers 144 include at least one Si—C—Si backbone. The process gases for forming the second dielectric layers 144 are $O_2$, $H_2O$, and/or other suitable gases. That is, the second dielectric layers 144 are oxygen-rich layers, and the second dielectric layers 144 include at least one Si—O bond. The depositing temperature performed at a temperature in a range from about 300° C. to about 500° C. Hence, the first dielectric layers 142 and the second dielectric layers 144 can be formed in the same chamber. In some embodiments, at least one of the second dielectric layers 144 is formed by performing n cycles of the ALD processes, where n≥1.

Hence, the composite dielectric layer 140 is made of $SiC_xO_y$. Since the first dielectric layers 142 and the second dielectric layers 144 include different composition of Si, C, and O, the concentrations of the Si, C, and O in the composite dielectric layer 140 are not uniform and vary periodically in the stacking direction D. Specifically, the concentration of Si in the first dielectric layer 142 is different from the concentration of Si in the second dielectric layer 144, the concentration of C in the first dielectric layer 142 is different from the concentration of C in the second dielectric layer 144, and the concentration of O in the first dielectric layer 142 is different from the concentration of O in the second dielectric layer 144. Taking a portion 146 of the composite dielectric layer 140 in contact with a bottom of the trench 114 as an example, the concentrations of Si, C, and O vary as the depth of the composite dielectric layer 140 increases.

The composite dielectric layer 140 has a carbon concentration in a range from about 16% to about 21%. The composite dielectric layer 140 has a Young's modulus in a range from about 5 GPa to about 80 GPa. The composite dielectric layer 140 has a dielectric constant in a range from about 3.0 to about 4.5 and a refractive index in a range from about 1.5 to about 1.8. The dielectric constant of the composite dielectric layer 140 is between that of the first and the second dielectric layers 142 and 144, and the refractive index of the composite dielectric layer 140 is between that of the first and the second dielectric layers 142 and 144. The composite dielectric layer 140 has a ($NF_3+NH_3$) etching selectivity to oxide in a range of about 10 to about 13.

The property of the composite dielectric layer 140 is related with the materials of the precursors, the materials of the process gases, the deposition cycles of the first and second dielectric layers 142 and 144, the layers of the first and second dielectric layers 142 and 144, the deposition temperature, the carbon addition, the plasma treatments, and/or other suitable parameters. As such, the chemical, mechanical, and/or optical properties of the composite dielectric layer 140 can be modulated by tuning the aforementioned parameters and according to actual situations.

Figure 1F:
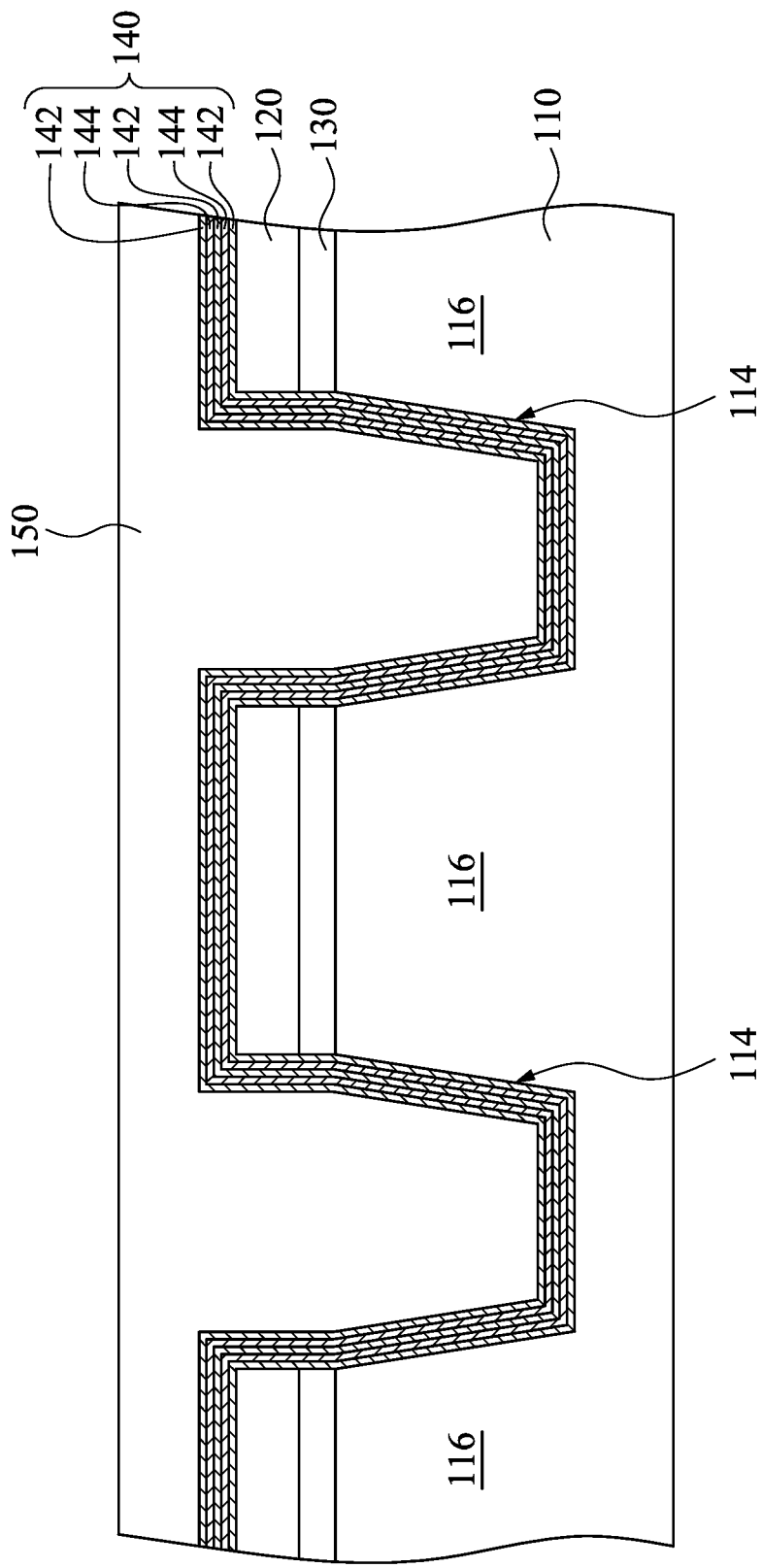

Reference is made to FIG. 1F. A dielectric material 150 overfills the trenches 114. The dielectric material 150 is formed by using a spin on dielectric (SOD) formation process, or by depositing a flowable dielectric by a chemical vapor deposition (CVD) process, such as radical-component CVD. The examples of flowable silicon oxide precursors, include a silicate, a siloxane, a methyl SilsesQuioxane (MSQ), a hydrogen SisesQuioxane (HSQ), an MSQ/HSQ, a perhydrosilazane (TCPS), a perhydro-polysilazane (PSZ), a tetraethyl orthosilicate (TEOS), or a silyl-amine (SA).

After the dielectric material 150 is deposited, an in-situ curing process may be performed on the as-deposited dielectric material 150. In-situ means the curing process is performed in the process chamber for depositing the dielectric material 150. In some embodiments, the curing process is performed in a different chamber (or ex-situ).

Figure 1G:
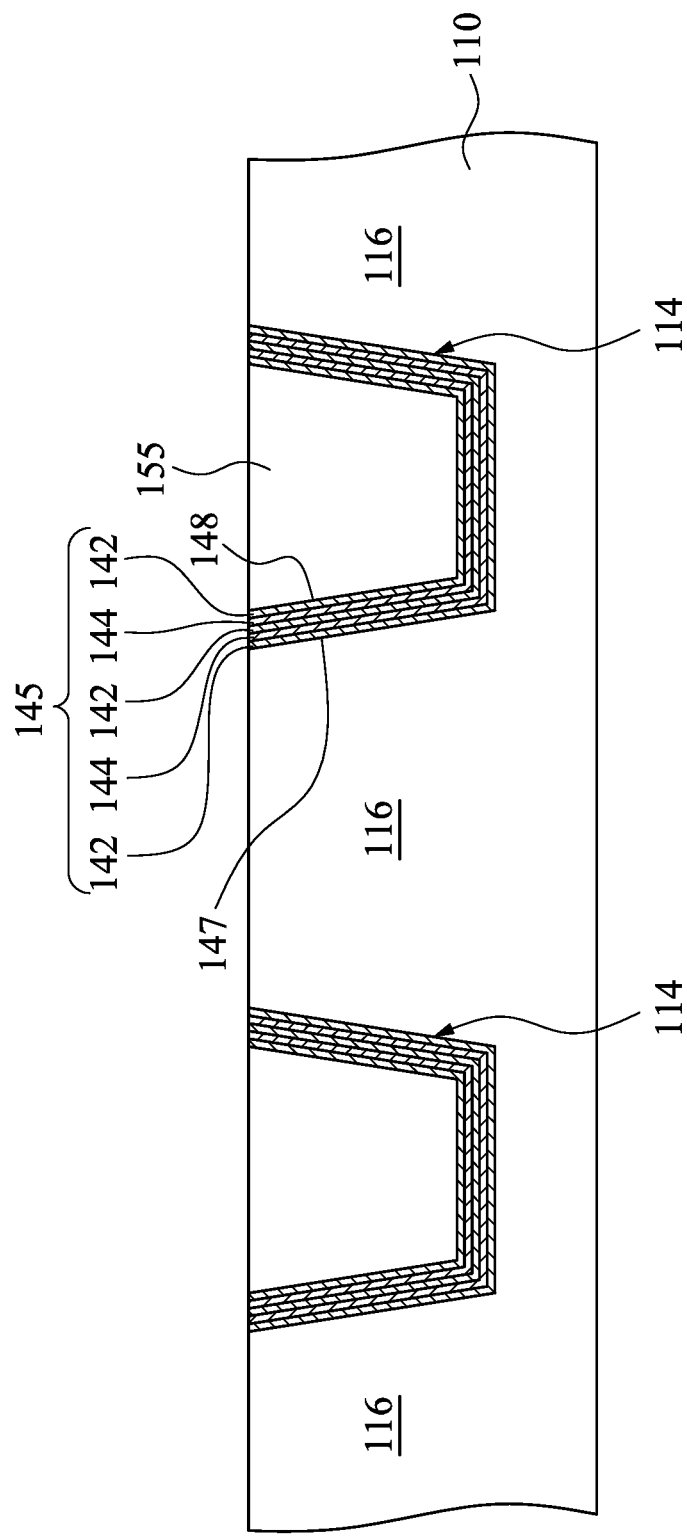

Reference is made to FIG. 1G. A planarization process is performed to remove the dielectric material 150 and the composite dielectric layer 140 outside the trench 114 to form the isolation structure 155 and the composite dielectric layer 145. In this embodiment, the composite dielectric layer 145 can be referred to as a liner layer 145, the first dielectric layer 142 can be referred to as a first liner layer 142, and the second dielectric layer 144 can be referred to as a second liner layer 144. The liner layer 145 has a first surface 147 facing the substrate 110 and a second surface 148 facing away from the substrate 110. As mentioned above, the concentration of carbon, the concentration of silicon, the concentration of nitrogen, and the concentration of oxygen varies from the first surface 147 to the second surface 148. The performance of the planarized structure can be improved since the composite dielectric layer 140 is modulated to have good mechanical strength and chemical selectivity. In some embodiments, the planarization process is a chemical-mechanical polishing (CMP) process. In some embodiments, the planarization process also removes the mask layer 120 and the protective layer 130 (see FIG. 1F). In some embodiments, a gate dielectric and a gate electrode (not shown) can be formed on or above the semiconductor fins 116 to form a FinFET.

Figure 2:
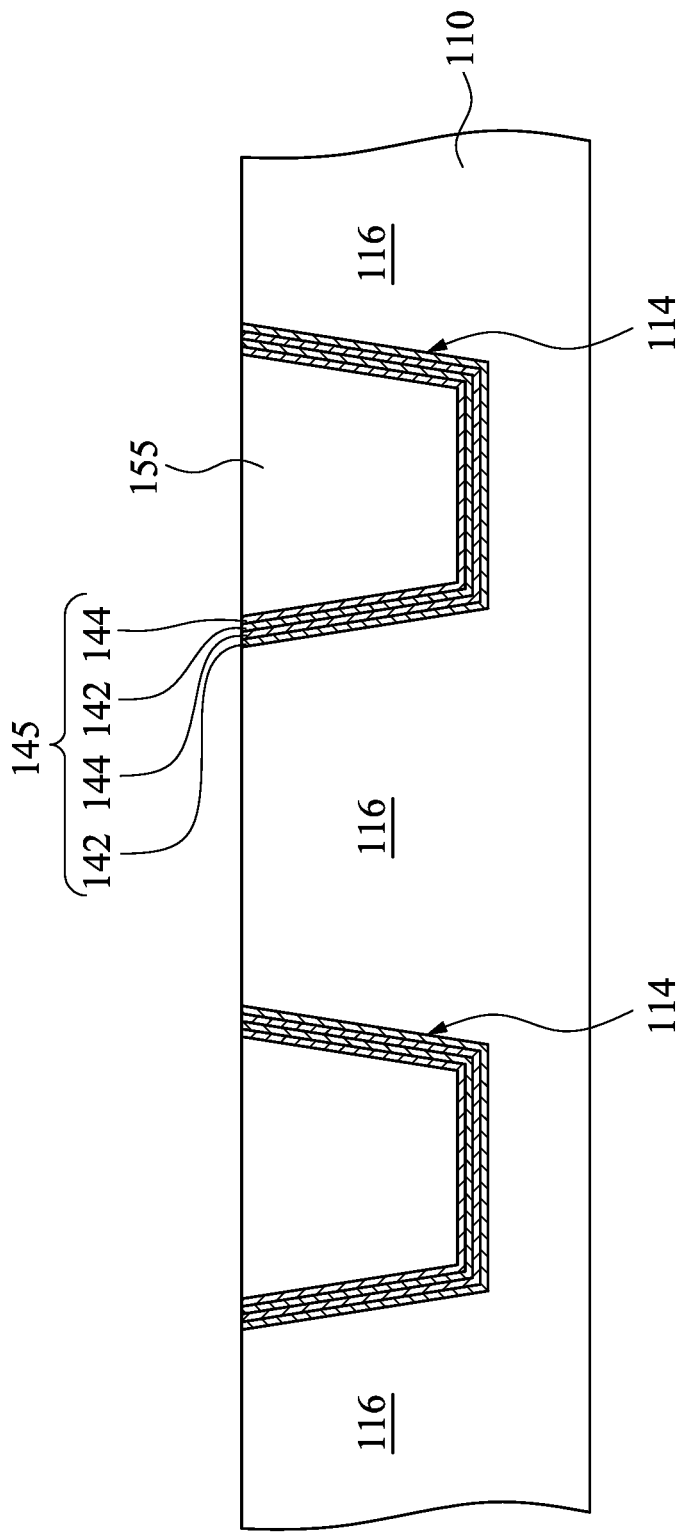
FIG. 2 is a cross-sectional view of a semiconductor structure in accordance with some embodiments of the present disclosure.

FIG. 2 is a cross-sectional view of a semiconductor structure in accordance with some embodiments of the present disclosure. The difference between the semiconductor structures of FIGS. 2 and 1G pertains to the layers of the composite dielectric layer 145. In FIG. 2, the composite dielectric layer 140 includes two layers of the first dielectric layers 142 and two layers of the second dielectric layers 144. That is, the topmost layer and the bottommost layer of the composite dielectric layer 145 are different. The topmost layer of the composite dielectric layer 145 is the second dielectric layer 144, and the bottommost layer of the composite dielectric layer 145 is the first dielectric layer 142. The selection of the topmost layer of the composite dielectric layer 145 can be determined according to a layer formed thereon. For example, the topmost layer may have a high selectivity to the layer formed thereon, such that the topmost layer can be used as an etch stop layer in the following process. Or, the topmost layer may have good adhesion to the layer formed thereon. Other relevant structural details of the semiconductor structure of FIG. 2 are similar to the semiconductor device of FIG. 1G, and, therefore, a description in this regard will not be repeated hereinafter.

FIGS. 3A-3E are cross-sectional views of a method for manufacturing a semiconductor structure at various stages in accordance with some embodiments of the present disclosure. In some embodiments, the semiconductor structure shown in FIGS. 3A-3E may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 3A:
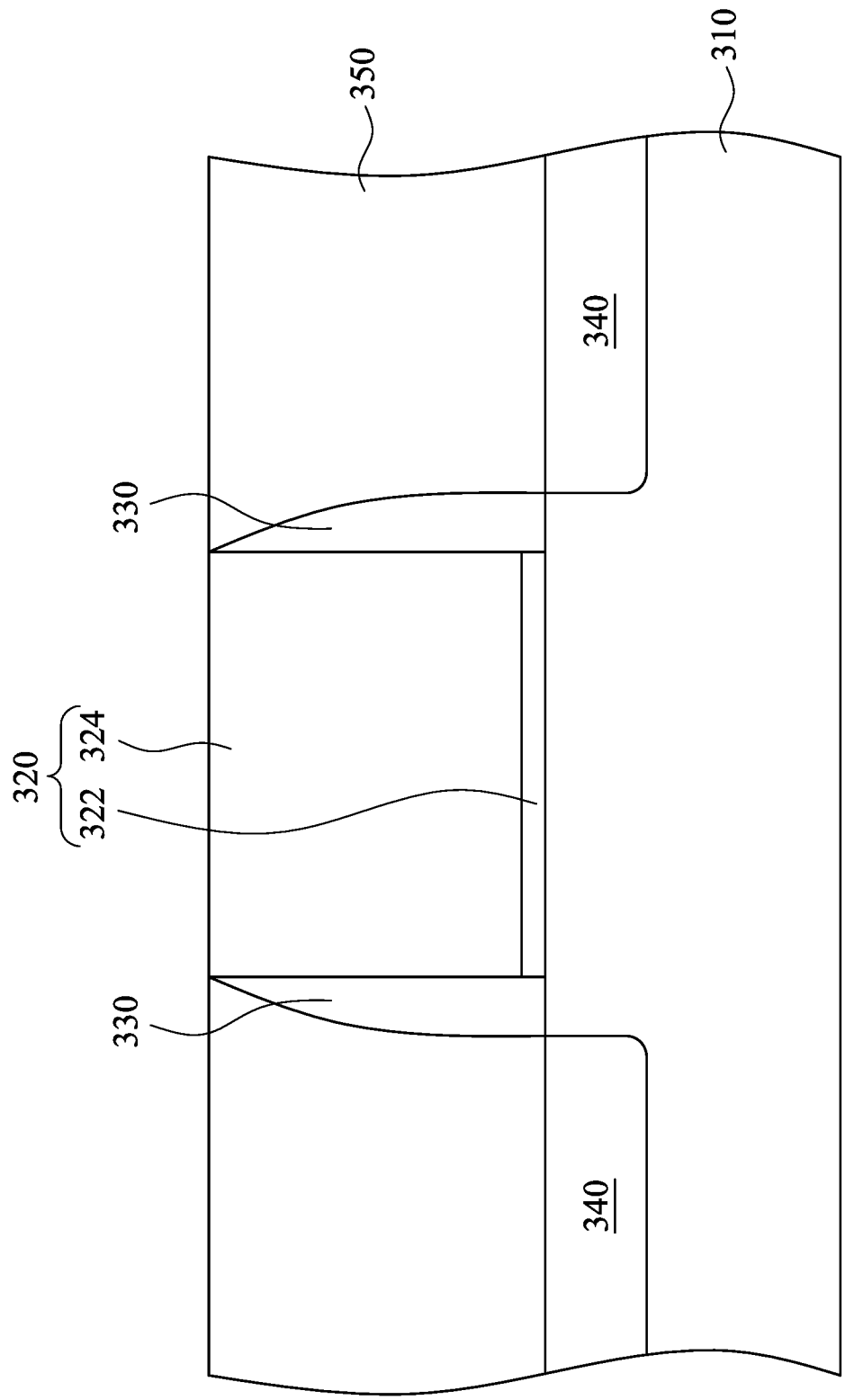
FIGS. 3A-3E are cross-sectional views of a method for manufacturing a semiconductor structure at various stages in accordance with some embodiments of the present disclosure.

Reference is made to FIG. 3A. A substrate 310 is provided. In some embodiments, the substrate 310 may include silicon (Si). Alternatively, the substrate 310 may include germanium (Ge), silicon germanium, gallium arsenide (GaAs), or other appropriate semiconductor materials. In some alternative embodiments, the substrate 310 may include an epitaxial layer. Furthermore, the substrate 310 may include a semiconductor-on-insulator (SOI) structure having a buried dielectric layer therein. The buried dielectric layer may be, for example, a buried oxide (BOX) layer. The SOI structure may be formed by a method referred to as separation by implantation of oxygen (SIMOX) technology, wafer bonding, selective epitaxial growth (SEG), or other appropriate method.

A dummy gate stack 320 is formed over the substrate 310. The dummy gate stack 320 includes a dummy gate dielectric 322 and a dummy gate electrode 324 over the dummy gate dielectric 322. In some embodiments, a dielectric layer (not shown) and a dummy gate layer (not shown) may be sequentially formed over the substrate 310. The dummy gate layer and the dielectric layer are then patterned to respectively form the dummy gate electrode 324 and the dummy gate dielectric 322. In some embodiments, the dummy gate electrode 324 may be made of polycrystalline-silicon (poly-Si), poly-crystalline silicon-germanium (poly-SiGe), or other suitable materials. The dummy gate dielectric 322 may be made of silicon dioxide or other suitable materials.

Spacer structures 330 are at least formed on opposite sides of the dummy gate stack 320. The spacer structures 330 include one or more dielectric materials, such as silicon oxide, silicon nitride, silicon oxynitride, SiCN, SiCxOyNz, or combinations thereof. The spacer structures 330 can be formed using a deposition method, such as plasma enhanced chemical vapor deposition (PECVD), low-pressure chemical vapor deposition (LPCVD), sub-atmospheric chemical vapor deposition (SACVD), or the like. The formation of the spacer structures 330 may include blanket forming spacer layers and then performing etching operations to remove the horizontal portions of the spacer layers. The remaining vertical portions of the spacer layers form the spacer structures 330.

A plurality of source/drain features 340 are formed (partially) in the substrate 310 and adjacent to the spacer structures 330. In some embodiments, the source/drain features 340 can be doped regions. In some other embodiments, the source/drain features 340 can be epitaxial structures. For example, a plurality of recesses can be formed in the substrate 310, and semiconductor materials are then epitaxially grown in the recesses to form the epitaxial structures. In some other embodiments, the epitaxial structures can be formed without forming the recesses.

An interlayer dielectric (ILD) 350 is formed over the substrate 110, the dummy gate stack 320, the spacer structures 330, and the source/drain features 340. The ILD 350 may be formed by chemical vapor deposition (CVD), high-density plasma CVD, spin-on, sputtering, or other suitable methods. In some embodiments, the ILD 350 includes silicon oxide. In some other embodiments, the ILD 350 may include silicon oxy-nitride, silicon nitride, or a low-k material.

Figure 3B:
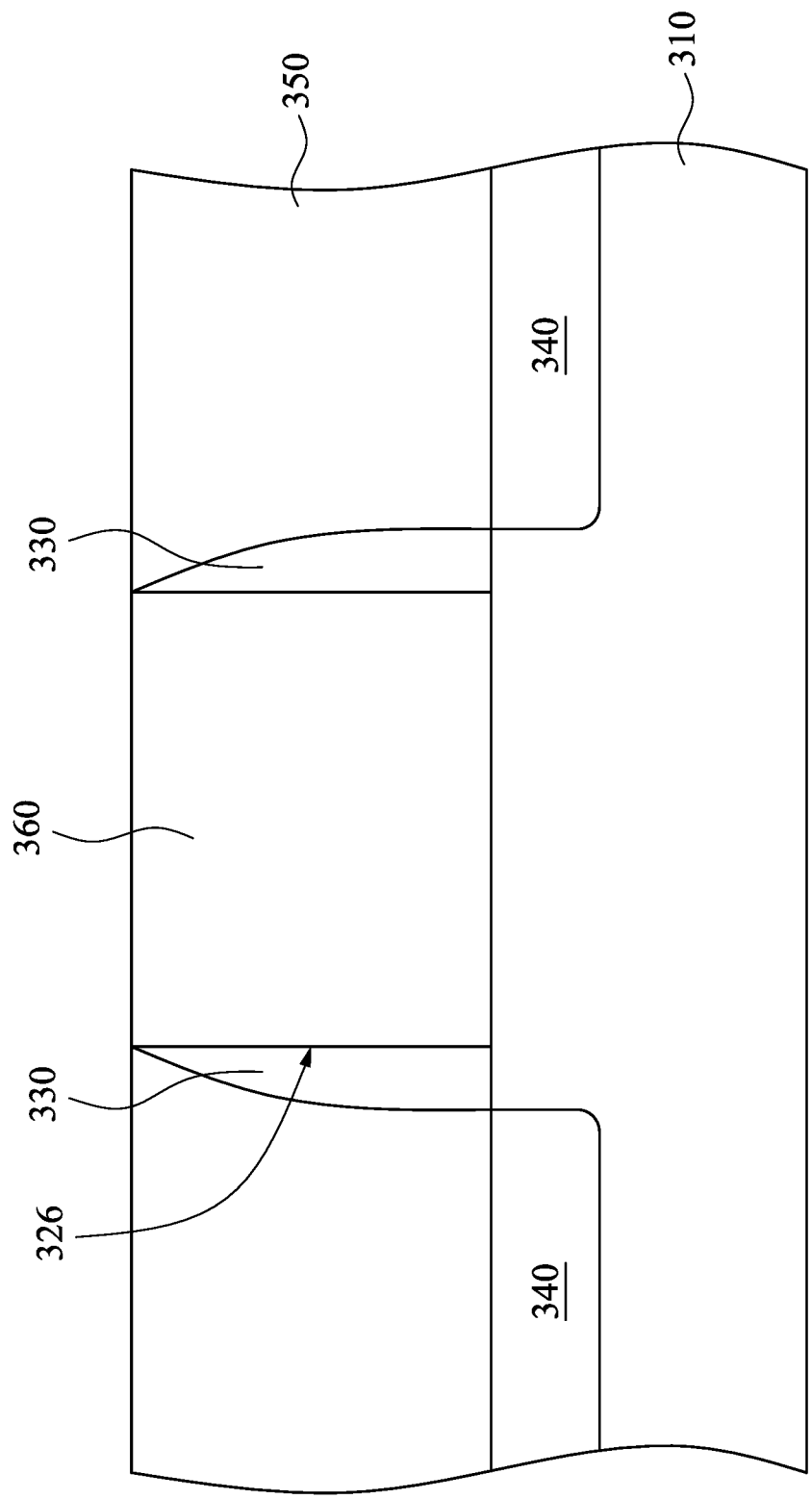

Reference is made to FIG. 3B. A replacement gate (RPG) process scheme is employed. In the RPG process scheme, a dummy polysilicon gate (the dummy gate electrode 324 (see FIG. 3A) in this case) is formed in advance and is replaced later by a metal gate. In some embodiments, the dummy gate electrode 324 is removed to form an opening 326 with the spacer structures 330 as its sidewalls. In some other embodiments, the dummy gate dielectric 322 (see FIG. 3A) is removed as well. Alternatively, in some embodiments, the dummy gate electrode 324 is removed while the dummy gate dielectric 322 retains. The dummy gate electrode 324 (and the dummy gate dielectric 322) may be removed by dry etch, wet etch, or a combination of dry and wet etch. For example, a wet etch process may include exposure to a hydroxide containing solution (e.g., ammonium hydroxide), deionized water, and/or other suitable etchant solutions.

A metal gate structure 360 is formed in the opening 326 and between the spacer structures 330. The metal gate structure 360 is formed by the deposition of metal layers including conductive metal such as aluminum, copper, tungsten, titanium, or other suitable materials. In some embodiments, depositing the opening 326 includes depositing a high-k dielectric layer and at least one work function layer prior to depositing a metal fill layer.

Figure 3C:
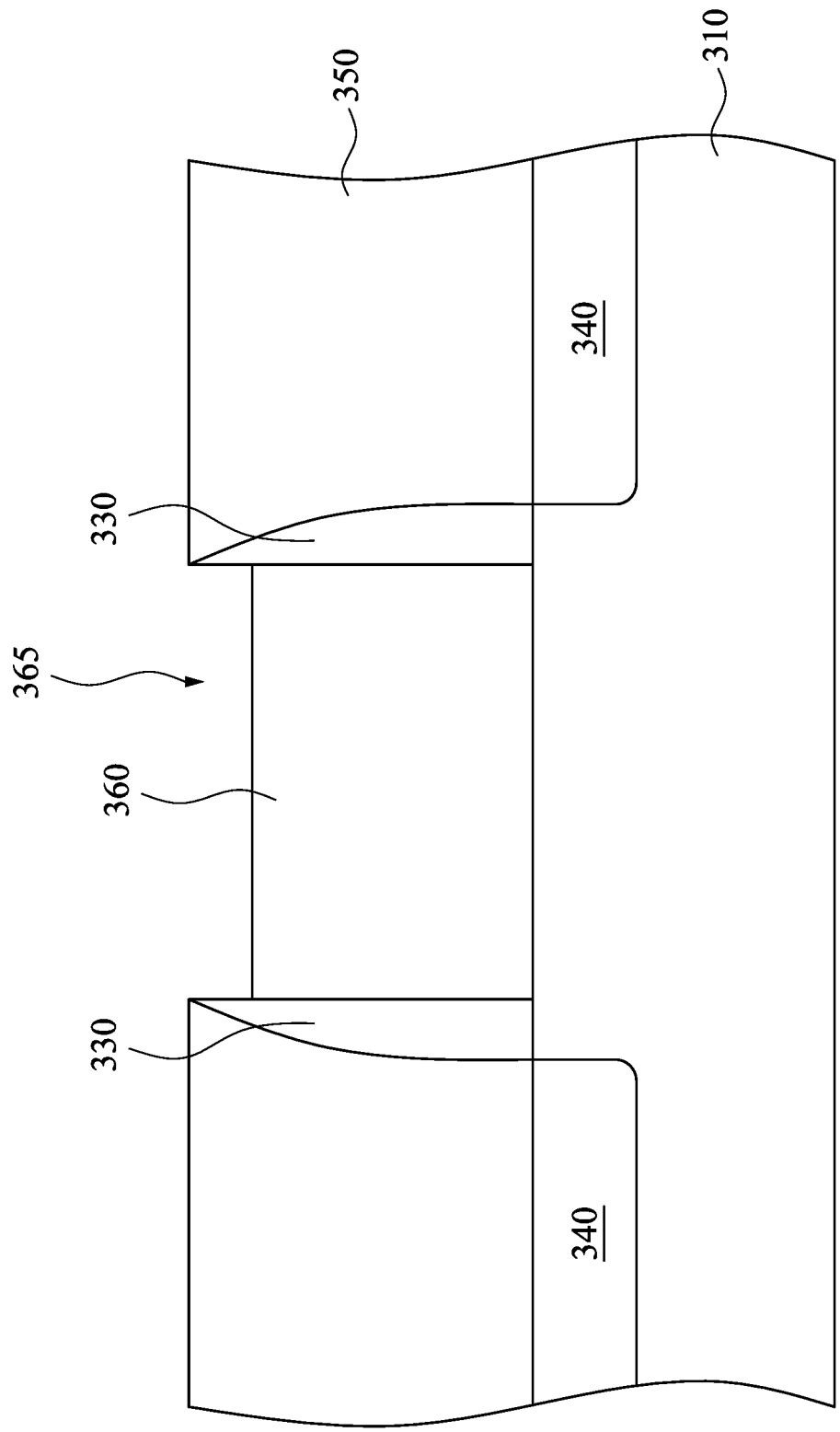

Reference is made to FIG. 3C. A portion of the metal gate structure 360 is removed. That is, the metal gate structure 360 is etched back to form a recess 365 thereon. The recess 365 is defined by the spacer structures 330 and the metal gate structure 360. In some embodiments, the metal gate structure 360 can be removed by performing at least one etching process. The etching process(es) may include a wet etch, a dry etch, and/or a combination thereof. In some embodiments, the etching process is chosen to selectively etch the metal gate structure 360 without substantially etching the ILD 350 and the spacer structures 330.

Figure 3D:
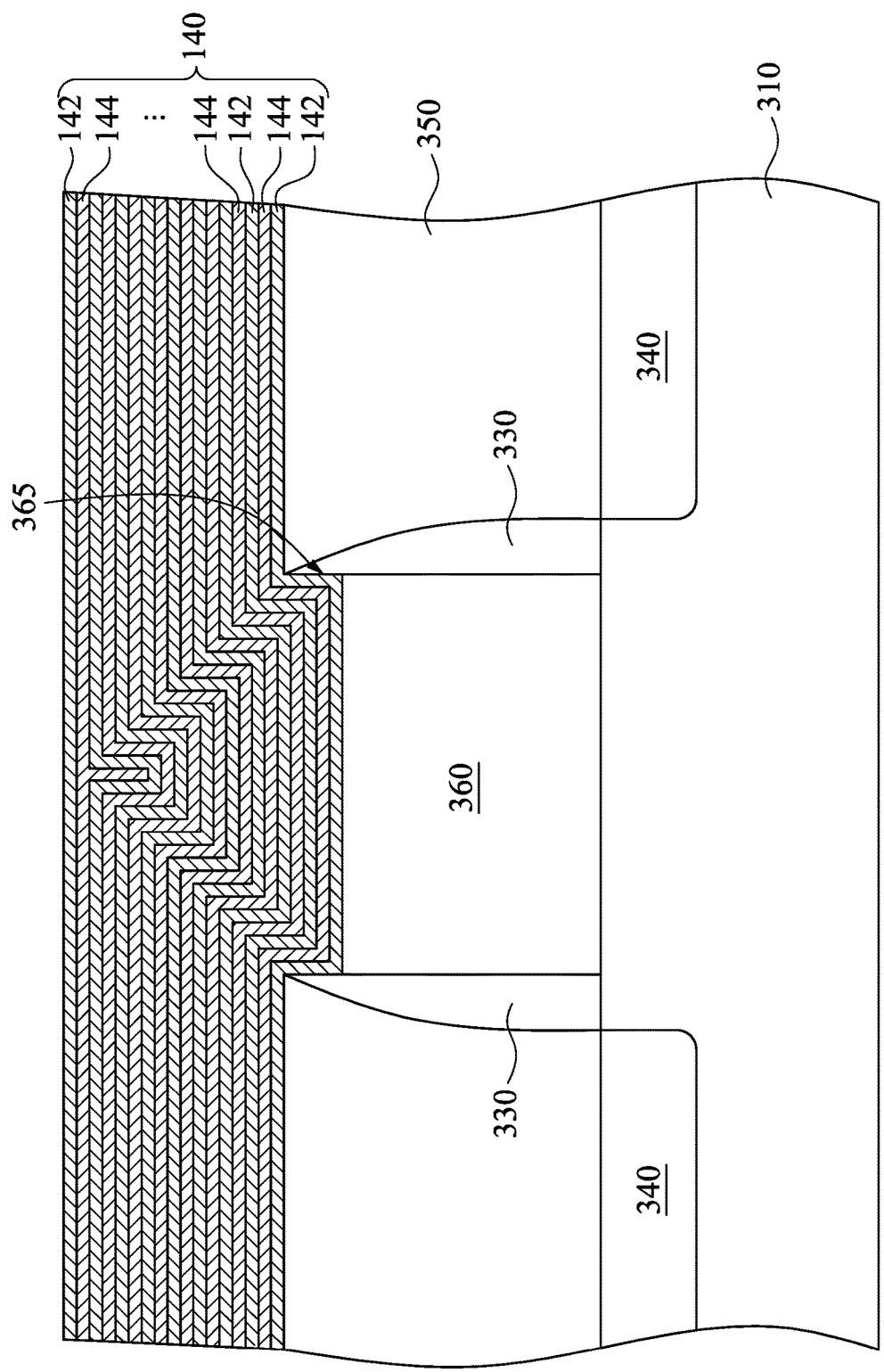

Reference is made to FIG. 3D. A composite dielectric layer 140 is formed over the structure of FIG. 3C. The composite dielectric layer 140 includes a plurality of first dielectric layers 142 and a plurality of second dielectric layers 144. For example, the composite dielectric layer 140 includes nine layers of the first dielectric layers 142 and eight layers of the second dielectric layers 144. That is, the topmost layer and the bottommost layer are both first dielectric layers 142. It is note that the layers of the first dielectric layers 142 and the second dielectric layers 144 in FIG. 3D are illustrative, and should not limit the claimed scope of the present disclosure. A person having ordinary skill in the art may select suitable layers for the first dielectric layers 142 and the second dielectric layers 144 according to actual situations. The first dielectric layers 142 in FIGS. 3D and 1C have the same or similar manufacturing processes and/or materials, and the second dielectric layers 144 in FIGS. 3D and 1C have the same or similar manufacturing processes and/or materials. Therefore, a description in this regard will not be repeated hereinafter.

Figure 3E:
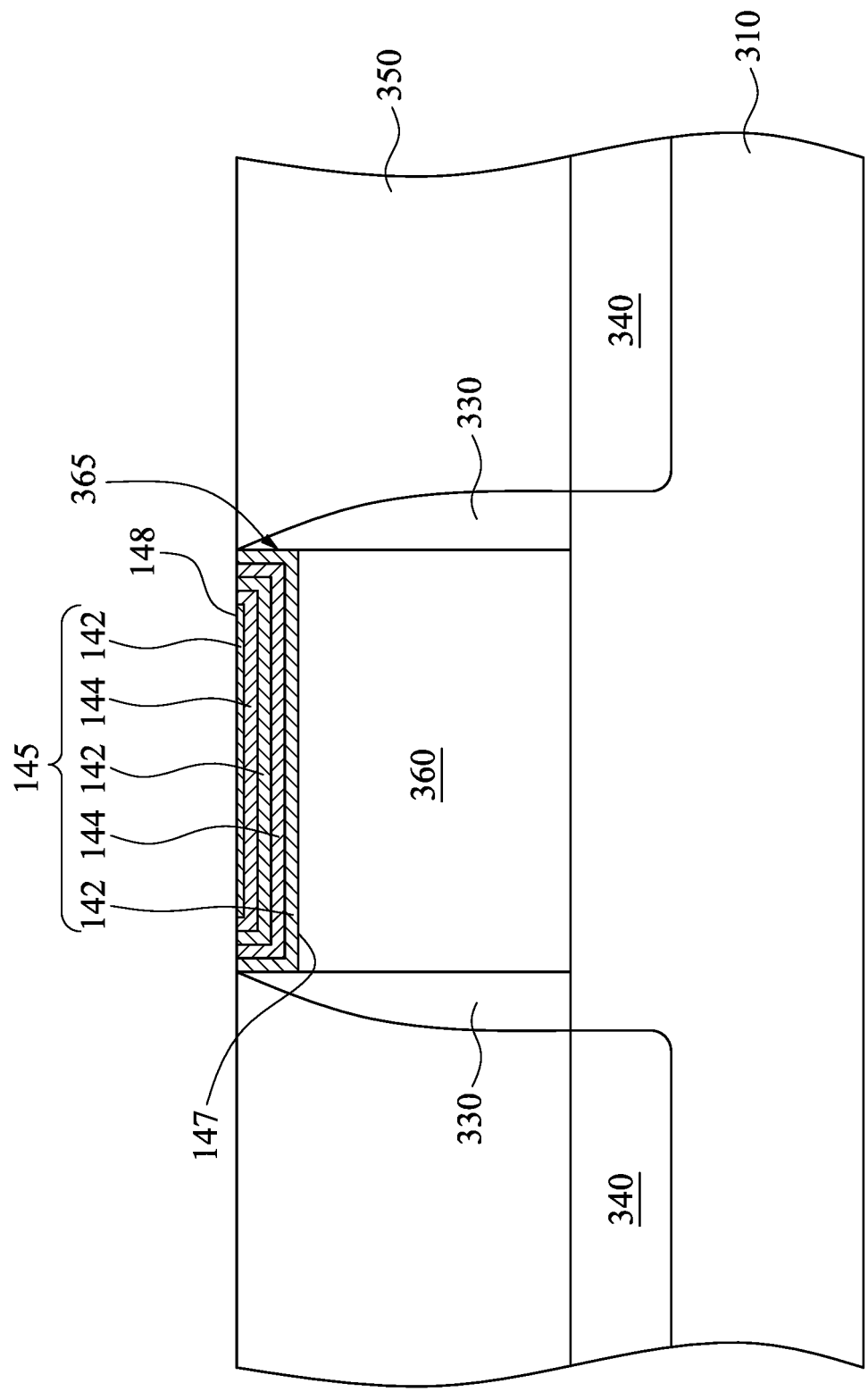

Reference is made to FIG. 3E. A planarization process is performed to remove the composite dielectric layer 140 outside the recess 365 to form the composite dielectric layer 145. In some embodiments, the planarization process is a chemical-mechanical polishing (CMP) process. The planarization process removes the composite dielectric layer 140 outside the recess 365. As such, the composite dielectric layer 145 serves as a hard mask that covers the metal gate structure 360 to protect the metal gate structure 360 from the damage in the following processes (such as etching processes). In this embodiment, the composite dielectric layer 145 can be referred to as a hard mask layer 145, the first dielectric layer 142 can be referred to as a first hard mask layer 142, and the second dielectric layer 144 can be referred to as a second hard mask layer 144. The hard mask layer 145 has a first surface 147 facing the metal gate structure 360 and a second surface 148 facing away from the metal gate structure 360. As mentioned above, the concentration of carbon, the concentration of silicon, the concentration of nitrogen, and the concentration of oxygen varies from the first surface 147 to the second surface 148.

Figure 4:
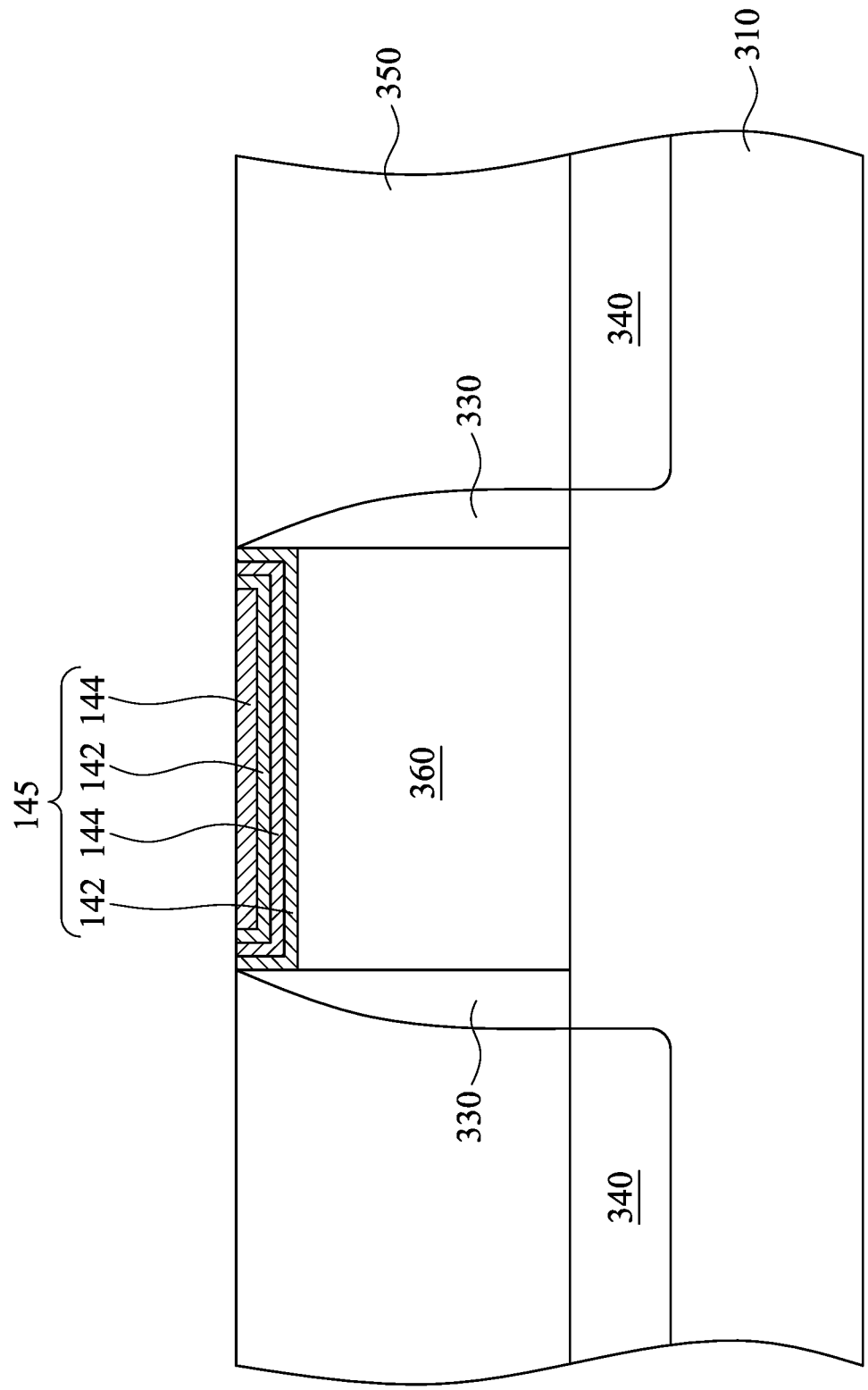
FIG. 4 is a cross-sectional view of a semiconductor structure in accordance with some embodiments of the present disclosure.

FIG. 4 is a cross-sectional view of a semiconductor structure in accordance with some embodiments of the present disclosure. The difference between the semiconductor structures of FIGS. 4 and 3E pertains to the layers of the composite dielectric layer 145. In FIG. 4, the composite dielectric layer 145 includes two layers of the first dielectric layers 142 and two layers of the second dielectric layers 144. That is, the topmost layer and the bottommost layer of the composite dielectric layer 145 are different. The topmost layer of the composite dielectric layer 145 is the second dielectric layer 144, and the bottommost layer of the composite dielectric layer 145 is the first dielectric layer 142. The selection of the topmost layer of the composite dielectric layer 145 can be determined according to a layer formed thereon. For example, the topmost layer may have a high selectivity to the layer formed thereon, such that the topmost layer can be used as an etch stop layer in the following process. Or, the topmost layer may have good adhesion to the layer formed thereon. Other relevant structural details of the semiconductor structure of FIG. 4 are similar to the semiconductor device of FIG. 3E, and, therefore, a description in this regard will not be repeated hereinafter.

FIGS. 5A-5E are cross-sectional views of a method for manufacturing a semiconductor structure at various stages in accordance with some embodiments of the present disclosure. In some embodiments, the semiconductor structure shown in FIGS. 5A-5E may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 5A:
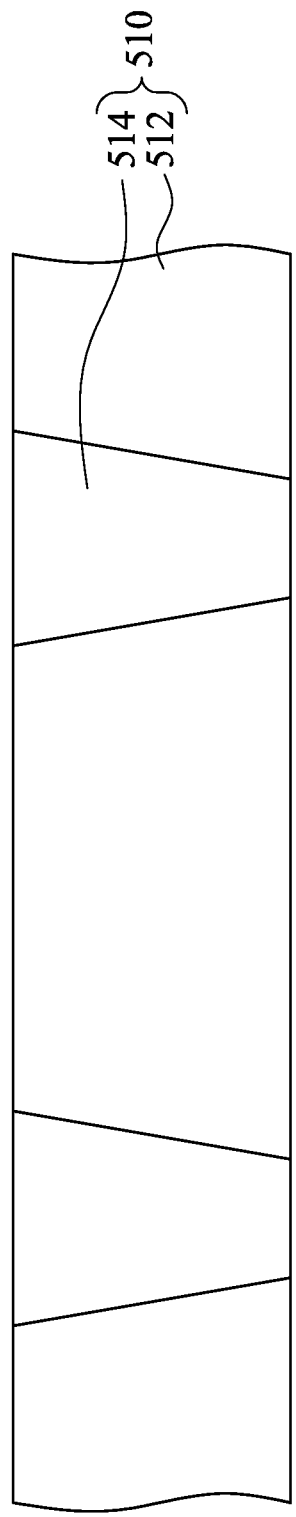
FIGS. 5A-5E are cross-sectional views of a method for manufacturing a semiconductor structure at various stages in accordance with some embodiments of the present disclosure.

Reference is made to FIG. 5A. A wafer 510 is provided. The wafer 510 includes a first interlayer dielectric 512. The wafer 510 may include a substrate (not explicitly shown) underlying the first dielectric layer 512, and may include, for example, bulk silicon, doped or undoped, or an active layer of a semiconductor-on-insulator (SOI) substrate. In some embodiments, an SOI substrate includes a layer of a semiconductor material, such as silicon, formed on an insulator layer. The insulator layer may be, for example, a buried oxide (BOX) layer or a silicon oxide layer. The insulator layer is provided on a substrate and may be a silicon or glass substrate. Other substrates, such as a multi-layered or gradient substrate may also be used.

In some embodiments, electrical circuitry is formed on the substrate and may be some types of circuitry suitable for a particular application. In some embodiments, the electrical circuitry includes electrical devices formed on the substrate with one or more dielectric layers overlying the electrical devices. Metal layers may be formed between overlying dielectric layers, such as those discussed herein, to route electrical signals between the electrical devices. Electrical devices may also be formed in one or more dielectric layers.

For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

The first interlayer dielectric 512 may be formed, for example, of a low-K dielectric material (materials having a dielectric constant lower than silicon dioxide), such as silicon oxynitride, phosphosilicate glass (PSG), borophosphosilicate glass (BPSG), fluorinated silicate glass (FSG), SiOxCy, SiOxCyHz, Spin-On-Glass, Spin-On-Polymers, silicon carbon material, compounds thereof, composites thereof, combinations thereof, or the like, by suitable methods, such as spinning, chemical vapor deposition (CVD), and plasma-enhanced CVD (PECVD). Other materials, such as ultra low-k materials (e.g., having a dielectric constant less than about 2.9), such as k=2.5-2.6, may also be used. These materials and processes are provided as examples and other materials and processes may be used.

Conductors 514 are formed in the first interlayer dielectric 512. The conductors 514 may be formed by, for example, creating openings in the first interlayer dielectric 512 using photolithography techniques. In some embodiments, photolithography techniques involve applying a photoresist material (not shown) and exposing the photoresist material in accordance with a desired pattern. The photoresist material is then developed to remove a portion of the photoresist material, thereby exposing the underlying material in accordance with the desired pattern. The remaining photoresist material protects the underlying material from subsequent processing operations, such as etching, performed to form the openings in which the conductors 514 are to be formed in the first interlayer dielectric 512. The etching process may be a wet or dry, anisotropic or isotropic, etch process, such as an anisotropic dry etch process. After the openings are formed in the first interlayer dielectric 512, a conductive material may be deposited to fill the openings. The conductors 514 may include metals, elemental metals, transition metals, or the like, such as a copper interconnect.

Figure 5B:
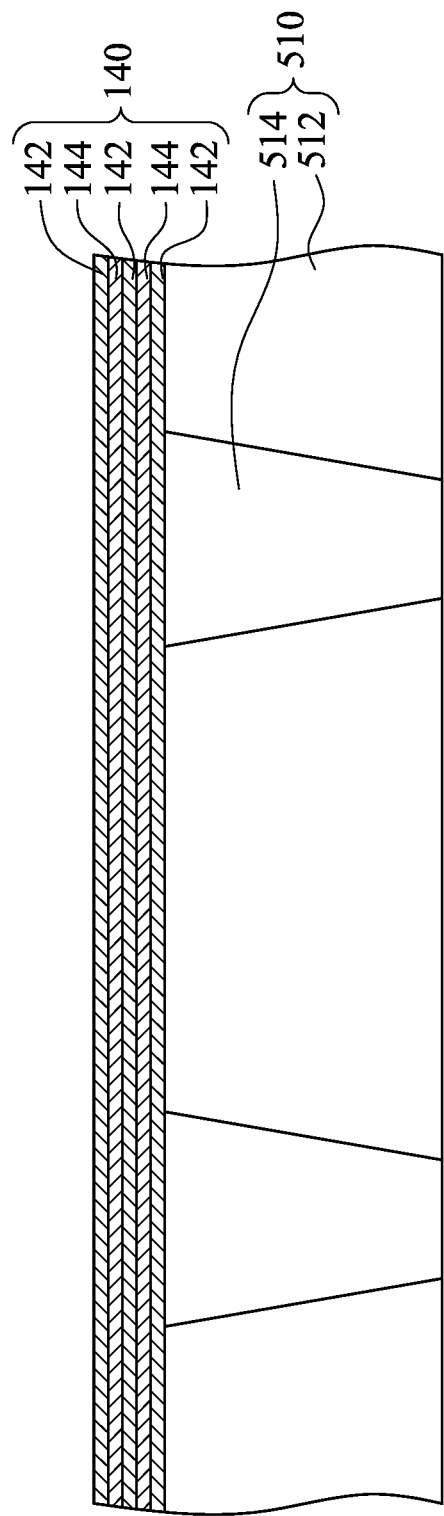

Reference is made to FIG. 5B. A composite dielectric layer 140 is formed over the structure of FIG. 5A. The composite dielectric layer 140 is configured to be an etch stop layer (ESL) providing a mechanism to stop an etching process when forming vias and/or contacts thereon. The composite dielectric layer 140 includes a plurality of first dielectric layers 142 and a plurality of second dielectric layers 144. For example, the composite dielectric layer 140 includes three layers of the first dielectric layers 142 and two layers of the second dielectric layers 144. That is, the topmost layer and the bottommost layer are both first dielectric layers 142. It is note that the layers of the first dielectric layers 142 and the second dielectric layers 144 in FIG. 5B are illustrative, and should not limit the claimed scope of the present disclosure. A person having ordinary skill in the art may select suitable layers for the first dielectric layers 142 and the second dielectric layers 144 according to actual situations. Furthermore, the optical reflectance of the composite dielectric layer 140 can be tuned by selecting the optical reflectance of the first and second dielectric layers 142 and 144. For example, first dielectric layer 142 has a first optical reflectance, and the second dielectric layer 144 has a second optical reflectance. Hence, the composite dielectric layer 140 has a optical reflectance between the first optical reflectance of the first dielectric layer 142 and the second optical reflectance of the second dielectric layer 144. The composite dielectric layer 140 with the tuned optical reflectance can improve the optical performance during the following patterning (lithography) process. The first dielectric layers 142 in FIGS. 5B and 1C have the same or similar manufacturing processes and/or materials, and the second dielectric layers 144 in FIGS. 5B and 1C have the same or similar manufacturing processes and/or materials. Therefore, a description in this regard will not be repeated hereinafter.

Figure 5C:
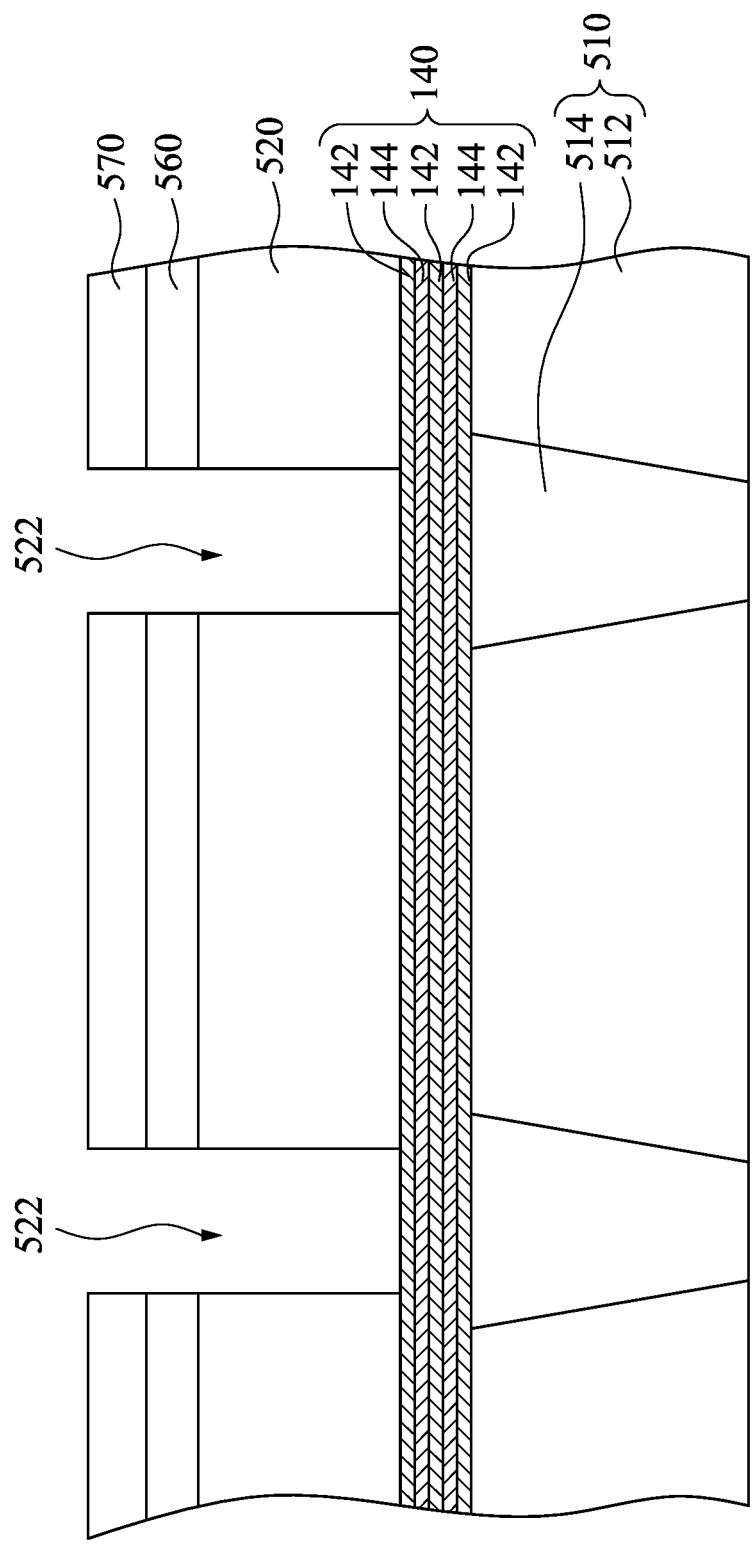

Reference is made to FIG. 5C. A second interlayer dielectric 520 is formed over the composite dielectric layer 140 in accordance with some embodiments. The second interlayer dielectric 520 is a layer that is to be subsequently patterned to, for example, form conductive lines and/or vias. For example, the second interlayer dielectric 520 may be patterned to form vias extending to the conductors 514 and to form conductive lines to interconnect various electrical elements.

The second interlayer dielectric 520 may be formed of similar materials using similar processes as those used to form the first interlayer dielectric 512; however, different materials and processes may be used. Additionally, the second interlayer dielectric 520 may be formed of the same or different material as that used to form the first interlayer dielectric 512.

Layers are formed over the second interlayer dielectric 520. Anti-Reflective coating Layer (ARL) 560 is formed over the second interlayer dielectric 520. ARL 560 may be a Nitrogen-Free ARL (NFARL), which may be formed of an oxide in accordance with some exemplary embodiments. For example, NFARL may include silicon oxide formed using plasma enhanced chemical vapor deposition (PECVD). Mask layer 570 is formed over the ARL 560. The mask layer 570 is also referred to as hard mask layer 570 hereinafter. In accordance with some embodiments, the hard mask layer 570 includes a metal(s), which may be in the form of a metal nitride. The hard mask layer 570 may also be formed of a non-metal nitride such as silicon nitride, an oxynitride such as silicon oxynitride, or the like. Another ARL may be further formed over the hard mask layer 570. ARL may also be an NFARL, which may be formed of an oxide, such as silicon oxide formed using PECVD.

ARL and the hard mask layer 570 are patterned to from openings. In accordance with some embodiments, the openings are formed using a two-patterning-two-etching (2P2E)

process. The patterned ARL and the hard mask layer 570 are used as an etching mask to etch ARL 560 and the second interlayer dielectric 520. Accordingly, the openings extend into the second interlayer dielectric 520 to form the openings 522. The etching is finished when the openings 522 expose the composite dielectric layer 140. During the etching, ARL formed above the hard mask layer 570 may be consumed, leaving the hard mask layer 570 as a top layer as shown in FIG. 5C.

The composite dielectric layer 140 serves as the etch stop layer for etching the openings 522. By tuning the mechanical/chemical properties (such as the etching selectively) of the composite dielectric layer 140, the depths of the openings 522 can be well controlled. For example, the first dielectric layer 142 (O-rich layer) can be the topmost layer of the composite dielectric layer 140 if the second interlayer dielectric 520 is a nitride layer. Therefore, the etching process has high selectivity between the second interlayer dielectric 520 and the composite dielectric layer 140.

Figure 5D:
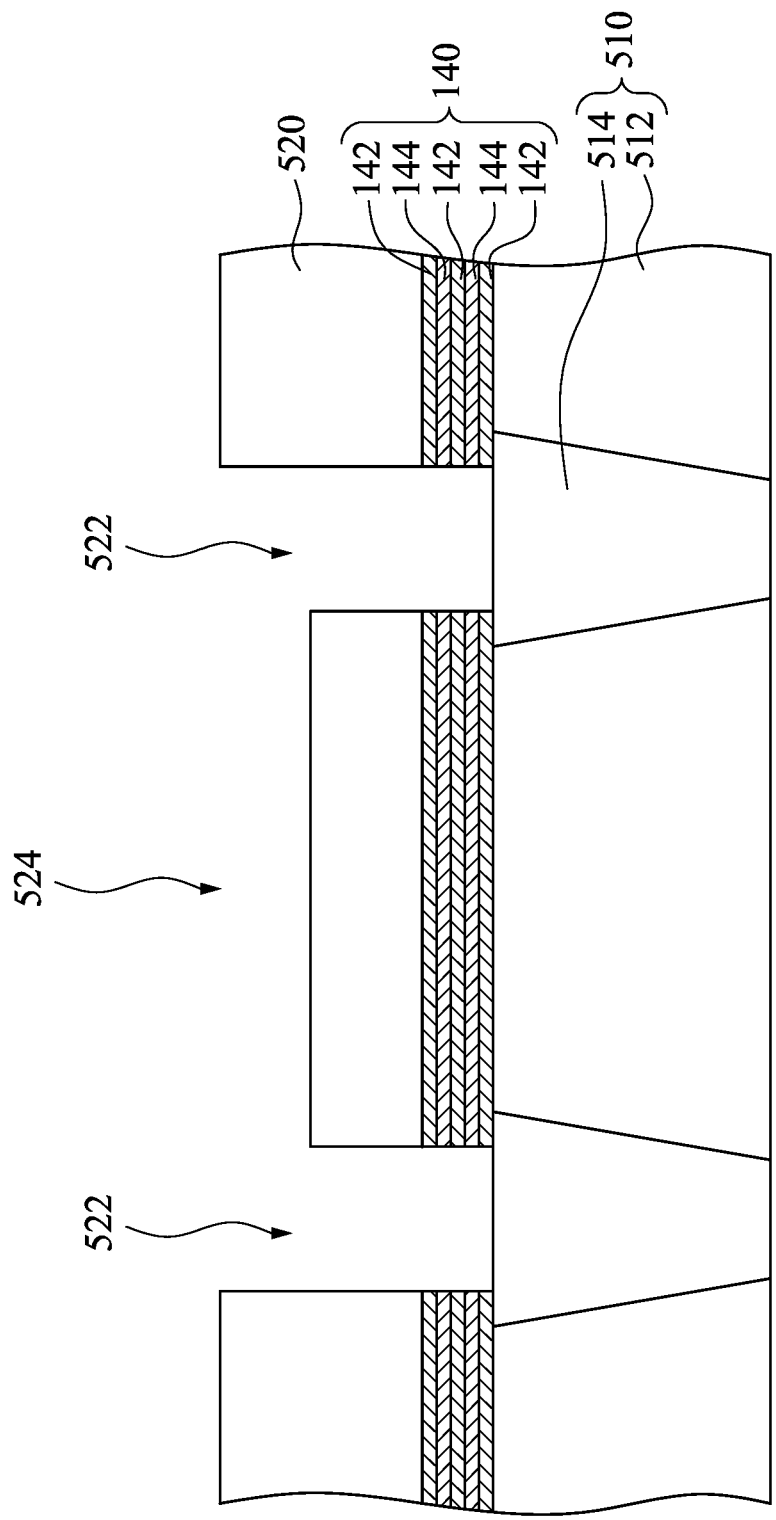

Reference is made to FIG. 5D. At least one of trench 524 is formed in the second interlayer dielectric 520. The trench 524 may interconnect the openings 522 in some embodiments. Moreover, the openings 522 pass through the composite dielectric layer 140 to respectively expose the conductors 514. In some embodiments, the openings 522 and the trench 524 may be formed by performing multiple etching processes. After the openings 522 and the trench 524 are formed, the hard mask layer 570 and the ARL 560 (see FIG. 5C) are removed.

Figure 5E:
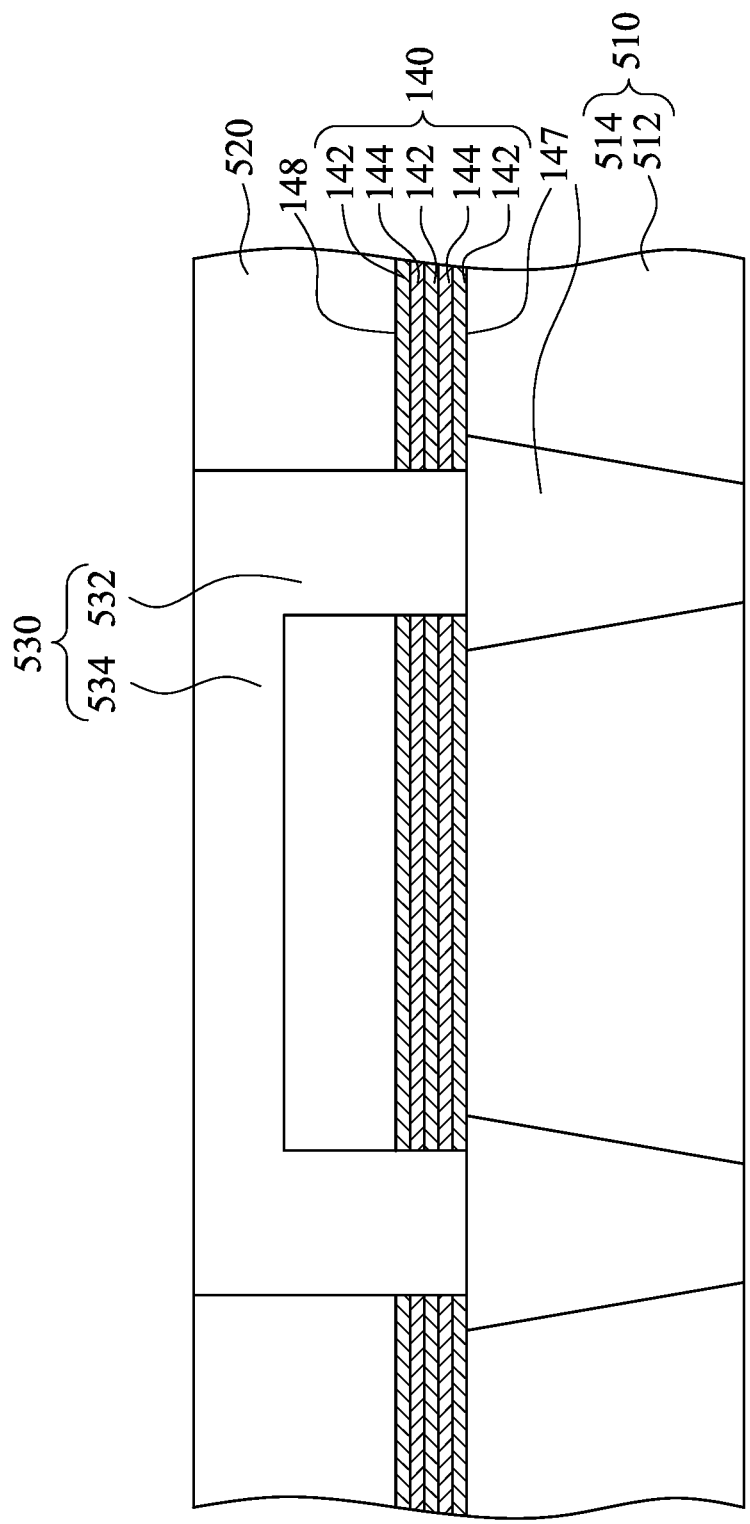

Reference is made to FIG. 5E. A conductive material is formed in the openings 522 and the trench 524. The conductive material at least includes metal element, e.g., copper (Cu). The conductive material may include other suitable materials such as Ru, W, Ti, Al, Co, or combinations thereof.

A chemical mechanical polishing (CMP) process is performed after the formation of the conductive material to remove the excess portions of the conductive material outside the trench 524, thus exposing the top surface of the second interlayer dielectric 520 and achieving a planarized surface. The portions of the conductive material in the openings 522 are referred to as vias 532, and the portion of the conductive material in the trench 524 is referred to as a conductive line 534. That is, the vias 532 and the conductive line 534 are conductors. The vias 532 are in contact with the conductors 514. In some embodiments, the conductive line 534 interconnects the vias 532, and the present disclosure is not limited in this respect. In this embodiment, the composite dielectric layer 145 can be referred to as an etch stop layer 145, the first dielectric layer 142 can be referred to as a first etch stop layer 142, and the second dielectric layer 144 can be referred to as a second etch stop layer 144. The etch stop layer 145 has a first surface 147 facing the first interlayer dielectric 510 and a second surface 148 facing away from the first interlayer dielectric 510. As mentioned above, the concentration of carbon, the concentration of silicon, the concentration of nitrogen, and the concentration of oxygen varies from the first surface 147 to the second surface 148.

Figure 6:
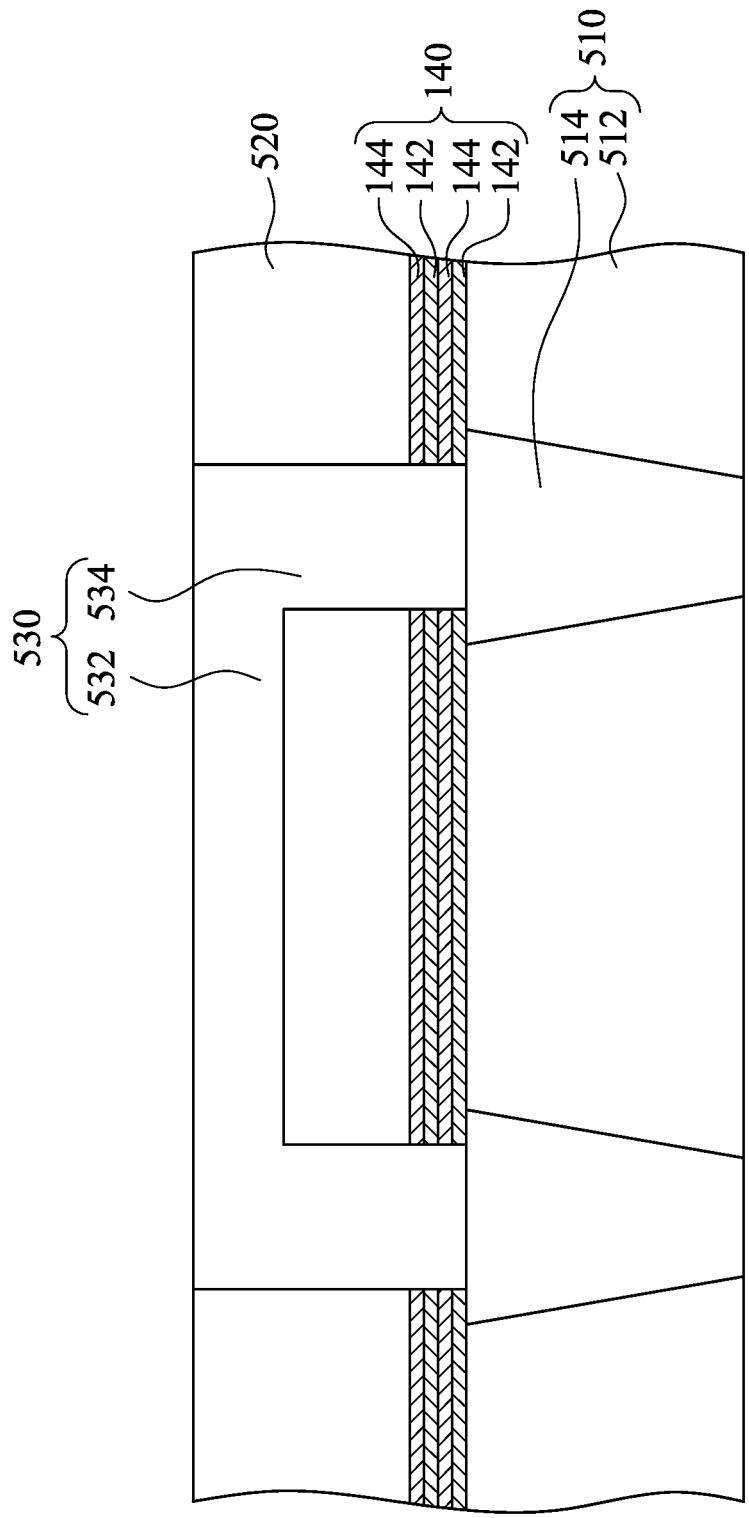
FIG. 6 is a cross-sectional view of a semiconductor structure in accordance with some embodiments of the present disclosure.

FIG. 6 is a cross-sectional view of a semiconductor structure in accordance with some embodiments of the present disclosure. The difference between the semiconductor structures of FIGS. 6 and 5D pertains to the layers of the composite dielectric layer 140. In FIG. 6, the composite dielectric layer 140 includes two layers of the first dielectric layers 142 and two layers of the second dielectric layers 144. That is, the topmost layer and the bottommost layer of the composite dielectric layer 140 are different. The topmost layer of the composite dielectric layer 140 is the second dielectric layer 144, and the bottommost layer of the composite dielectric layer 140 is the first dielectric layer 142. The selection of the topmost layer of the composite dielectric layer 140 can be determined according to a layer formed thereon. For example, the topmost layer may have a high selectivity to the layer formed thereon (i.e., the second interlayer dielectric 520 in this case), such that the topmost layer can be used as an etch stop layer in the following process. Or, the topmost layer may have good adhesion to the layer formed thereon. Other relevant structural details of the semiconductor structure of FIG. 6 are similar to the semiconductor device of FIG. 5E, and, therefore, a description in this regard will not be repeated hereinafter.

In some other embodiments, the composite dielectric layer can be applied to be a mask that defines a pattern area using a tri-layer stacking including photoresist (PR), silicon containing anti-reflective coating (SiARC) (or referred to as a middle layer (ML), and an optical planarization layer (or referred to as a bottom layer (BL). A dielectric anti-reflective coating (DARC) can be formed over the middle layer in some embodiments. In still some other embodiments, dry etching processes with $NF_3$-based, $NH_3$-based, F-based, $CH_xF_y$-based, $CF_x$-based, Cl-based, Br-based, $BCl_3$-based chemistry with or without plasma treatments can be applicable to the composite dielectric layer.

According to some embodiments, the conformal composite dielectric layer includes alternately stacked first and second dielectric layers. The first and second dielectric layers are formed with different silicon-containing precursors. The property of the composite dielectric layer is related with the materials of the precursors, the materials of the process gases, the deposition cycles of the first and second dielectric layers, the layers of the first and second dielectric layers, the deposition temperature, the carbon addition, the plasma treatments, and/or other suitable parameters. As such, the chemical, mechanical, and/or optical properties of the composite dielectric layer can be modulated by tuning the aforementioned parameters and according to actual situations.

According to some embodiments, a method includes forming an interlayer dielectric (ILD) and a gate structure over a substrate. The gate structure is surrounded by the ILD. The gate structure is etched to form a recess. A first dielectric layer is deposited over sidewalls and a bottom of the recess and over a top surface of the ILD using a first Si-containing precursor. A second dielectric layer is deposited over and in contact with the first dielectric layer using a second Si-containing precursor different from the first Si-containing precursor. A third dielectric layer is deposited over and in contact with the second dielectric layer using the first Si-containing precursor. Portions of the first, second, and third dielectric layer over the top surface of the ILD are removed.

According to some embodiments, the first, second, and third dielectric layers are deposited in the same chamber.

According to some embodiments, the first, second, and third dielectric layers are deposited at substantially the same temperature.

According to some embodiments, depositing the first dielectric layer is performed using a nitrogen-containing process gas.

According to some embodiments, depositing the second dielectric layer is performed using an oxygen-containing process gas.

According to some embodiments, the depositing the third dielectric layer is performed using a nitrogen-containing process gas.

According to some embodiments, the first dielectric layer is substantially free from Si—C—Si.

According to some embodiments, the second dielectric layer comprises Si—C—Si.

According to some embodiments, the method further includes forming a fourth dielectric layer over and in contact with the third dielectric layer using the second Si-containing precursor.

According to some embodiments, the method further includes adding carbon into the first dielectric layer.

According to some embodiments, a method includes etching a semiconductor substrate to form a trench extending from a top surface of the semiconductor substrate into the semiconductor substrate. A first liner layer is deposited over sidewalls and a bottom of the trench using a first Si-containing precursor. A second liner layer is deposited conformally over the first liner layer using a second Si-containing precursor different from the first Si-containing precursor. A third liner layer is deposited conformally over the second liner layer using the first Si-containing precursor. A dielectric material is filled into the trench and over the third liner layer. Excess portions of the dielectric material over the top surface of the semiconductor substrate are removed.

According to some embodiments, the method further includes depositing a fourth liner layer conformally over the third liner layer using the second Si-containing precursor to fill the dielectric material into the trench.

According to some embodiments, the first Si-containing precursor comprises Si—Si.

According to some embodiments, the second Si-containing precursor comprises Si—C—Si.

According to some embodiments, a device includes a first dielectric layer, a first conductor, an etch stop layer, a second dielectric layer, and a second conductor. The first conductor is in the first dielectric layer. The etch stop layer is over the first dielectric layer. The etch stop layer has a first surface facing the first dielectric layer and a second surface facing away from the first dielectric layer, and a concentration of carbon in the etch stop layer periodically varies from the first surface to the second surface. The second dielectric layer is over the etch stop layer. The second conductor is in the second dielectric layer and the etch stop layer and electrically connected to the first conductor.

According to some embodiments, a concentration of oxygen in the etch stop layer periodically varies from the first surface to the second surface.

According to some embodiments, a concentration of nitrogen in the etch stop layer periodically varies from the first surface to the second surface.

According to some embodiments, the etch stop layer comprises Si—C—Si and Si—Si.

According to some embodiments, the etch stop layer further comprises Si—C—O.

According to some embodiments, the etch stop layer further comprises Si—C—N.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a gate structure over a substrate;
   an interlayer dielectric (ILD) layer over the substrate and laterally surrounding the gate structure;
   a gate spacer between the gate structure and the ILD layer; and
   a dielectric cap over the gate structure and comprising:
     a first dielectric layer comprising a first portion extending along a top surface of the gate structure and a second portion extending along an inner sidewall of the gate spacer, wherein the first dielectric layer is a first nitrogen-rich layer on and in contact with the gate structure;
     a second dielectric layer comprising a first portion extending along the first portion of the first dielectric layer and a second portion extending along the second portion of the first dielectric layer, wherein the second dielectric layer is a first oxygen-rich layer on and in contact with the first nitrogen-rich layer;
     a third dielectric layer over the first oxygen-rich layer, wherein the third dielectric layer is a second nitrogen-rich layer on and in contact with the first oxygen-rich layer;
     a fourth dielectric layer over the second nitrogen-rich layer, wherein the fourth dielectric layer is a second oxygen-rich layer on and in contact with the second nitrogen-rich layer; and
     a fifth dielectric layer over the fourth dielectric layer, wherein the fifth dielectric layer is thinner than the second dielectric layer.

2. The device of claim 1, wherein the first dielectric layer comprises Si—N.

3. The device of claim 1, wherein the second dielectric layer comprises Si—C—Si.

4. The device of claim 1, wherein the fifth dielectric layer is spaced apart from the gate spacer.

5. The device of claim 1, wherein the fifth dielectric layer is spaced apart from the gate structure.

6. The device of claim 1, wherein the fifth dielectric layer is thinner than the first dielectric layer.

7. The device of claim 1, wherein a topmost surface of the fifth dielectric layer is wider than a topmost surface of the second dielectric layer.

8. The device of claim 1, wherein a thickness of the fifth dielectric layer is different from a thickness of the first dielectric layer or the third dielectric layer.

9. The device of claim 1, wherein the fifth dielectric layer is a third nitrogen-rich layer on and in contact with the second oxygen-rich layer.

10. The device of claim 1, wherein the fifth dielectric layer is thinner than the fourth dielectric layer.

11. A device comprising:
    an interlayer dielectric (ILD) layer over a substrate;
    a gate structure laterally surrounded by the ILD layer, wherein a top surface of the gate structure is lower than a top structure of the ILD layer;
    a gate spacer extending along a sidewall of the gate structure to past the top surface of the gate structure; and
    a dielectric cap over the gate structure and in contact with the gate spacer, wherein a concentration of nitrogen in the dielectric cap periodically varies from a center of a top of the dielectric cap to an edge of the dielectric cap, the dielectric cap comprises:
- a first nitrogen-rich layer on and in contact with the gate structure;
- a first oxygen-rich layer on and in contact with the first nitrogen-rich layer;
- a second nitrogen-rich layer on and in contact with the first oxygen-rich layer; and
- a second oxygen-rich layer on and in contact with the second nitrogen-rich layer.

12. The device of claim 11, wherein a concentration of carbon in the dielectric cap increases along a thickness direction of the dielectric cap while the concentration of nitrogen decreases.

13. The device of claim 11, wherein a concentration of oxygen in the dielectric cap periodically varies from the center of the top of the dielectric cap to the edge of the dielectric cap.

14. The device of claim 11, wherein the dielectric cap comprises $SiC_xO_yN_z$, wherein x, y, and z are all greater than 0.

15. A device comprising:
- a gate structure over a substrate;
- a composite dielectric layer over the gate structure and comprising:
  - a first nitrogen-rich layer on and in contact with the gate structure;
  - a first oxygen-rich layer on and in contact with the first nitrogen-rich layer;
  - a second nitrogen-rich layer on and in contact with the first oxygen-rich layer, wherein a topmost surface of the first nitrogen-rich layer is substantially coplanar with a topmost surface of the second nitrogen-rich layer and the topmost surface of the first oxygen-rich layer is substantially coplanar with a topmost surface of the first oxygen-rich layer; and
  - a second oxygen-rich layer on and in contact with the second nitrogen-rich layer; and
- a gate spacer laterally surrounding the gate structure and the composite dielectric layer; and
- source/drain features on the substrate and on opposite sides of the gate structure.

16. The device of claim 15, wherein the topmost surface of the first nitrogen-rich layer is substantially coplanar with a topmost surface of the second oxygen-rich layer.

17. The device of claim 15, wherein the first nitrogen-rich layer is in contact with the gate spacer.

18. The device of claim 15, wherein the first oxygen-rich layer is separated from the gate spacer by the first nitrogen-rich layer.

19. The device of claim 15, wherein the first nitrogen-rich layer comprises Si—C—N backbones.

20. The device of claim 15, wherein the first oxygen-rich layer comprises Si—C—Si backbones.

* * * * *